US011340281B2

United States Patent
Lee et al.

(10) Patent No.: US 11,340,281 B2
(45) Date of Patent: May 24, 2022

(54) METHOD OF MEASURING ELECTROMAGNETIC SIGNAL AND ELECTRONIC DEVICE THEREFOR

(71) Applicant: Samsung Electronics Co., Ltd., Suwon-si (KR)

(72) Inventors: Youngbae Lee, Suwon-si (KR); Yongseob Yun, Suwon-si (KR); Seungwoo Lee, Suwon-si (KR); Jinchul Choi, Suwon-si (KR); Yongsang Yun, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 178 days.

(21) Appl. No.: 16/738,864

(22) Filed: Jan. 9, 2020

(65) Prior Publication Data
US 2020/0217882 A1 Jul. 9, 2020

(30) Foreign Application Priority Data
Jan. 9, 2019 (KR) .................. 10-2019-0002687

(51) Int. Cl.
| | | |
|---|---|---|
| *G01R 31/00* | (2006.01) | |
| *G01R 29/08* | (2006.01) | |
| *G01R 29/26* | (2006.01) | |

(52) U.S. Cl.
CPC ....... *G01R 31/002* (2013.01); *G01R 29/0814* (2013.01); *G01R 29/0878* (2013.01); *G01R 29/0892* (2013.01); *G01R 29/26* (2013.01)

(58) Field of Classification Search
CPC .. G01R 31/002; G01R 29/0814; G01R 29/26; G01R 29/0892; G01R 29/0878
(Continued)

(56) References Cited

U.S. PATENT DOCUMENTS 6,411,208 B1 * 6/2002 Buess .................... G01H 13/00
324/300
6,564,158 B1 * 5/2003 Rabel ................. G01R 29/0892
702/104

(Continued)

FOREIGN PATENT DOCUMENTS

| JP | 4030155 B2 | 1/2008 |
|---|---|---|
| KR | 10-2016-0000330 A | 1/2016 |
| KR | 10-1893519 B1 | 8/2018 |

OTHER PUBLICATIONS

Yang, Chouchang, and Alanson P. Sample. "EM-ID: Tag-less identification of electrical devices via electromagnetic emissions." 2016 IEEE International Conference on RFID (RFID). IEEE, 2016. (Year: 2016).*

(Continued)

*Primary Examiner* — Christopher P Mcandrew

(57) ABSTRACT

An electronic device and method related to measurement of an electromagnetic (EM) signal emitted from an external electronic device. The electronic device including a processor, a memory, and an EM sensor. The memory stores instructions, which, when executed, enable the processor to: obtain an input signal including an electromagnetic signal of an external electronic device and a self-noise using the EM sensor; identify an ambient condition of the electronic device; identify a compensation self-noise corresponding to the ambient condition; generate a signal pattern, based on the input signal and the compensation self-noise; and identify the external electronic device, based on at least a part of the signal pattern.

18 Claims, 29 Drawing Sheets

(58) Field of Classification Search
USPC .......................................................... 324/613
See application file for complete search history.

(56) References Cited

U.S. PATENT DOCUMENTS

| | | | |
|---|---|---|---|
| 7,464,005 B1 | 12/2008 | Beetner et al. | |
| 9,881,273 B2 | 1/2018 | Yang et al. | |
| 10,823,775 B2* | 11/2020 | Anderson | G01R 29/0878 |
| 10,859,620 B2* | 12/2020 | Bickford | G01R 29/0878 |
| 2006/0066469 A1* | 3/2006 | Foote | G01S 13/89 |
| | | | 342/22 |
| 2006/0139032 A1* | 6/2006 | Kalokitis | G01R 29/0814 |
| | | | 324/457 |
| 2007/0176600 A1* | 8/2007 | Laubacher | G01R 33/441 |
| | | | 324/300 |
| 2011/0102597 A1* | 5/2011 | Daly | G01S 13/887 |
| | | | 348/162 |
| 2014/0070810 A1* | 3/2014 | Robert | G01R 33/36 |
| | | | 324/322 |
| 2016/0259432 A1* | 9/2016 | Bau | G06F 3/04182 |
| 2016/0261268 A1 | 9/2016 | Rakova et al. | |
| 2017/0099200 A1* | 4/2017 | Ellenbogen | G06N 20/00 |
| 2017/0270198 A1 | 9/2017 | Sample et al. | |

OTHER PUBLICATIONS

International Search Report and Written Opinion of the International Searching Authority in connection with International Application No. PCT/KR2020/000401 dated Apr. 22, 2020, 7, pages.

Acharya, Shikhar P., et al., "Detection of RF devices based on their unintended electromagnetic emissions using Principal Components Analysis," 2013 Wireless Telecommunications Symposium (WTS), Phoenix, AZ, Apr. 17-19, 2013, IEEE, 7 pages.

Dong, Xiaopeng, et al., "Detection and Identification of Vehicles Based on Their Unintended Electromagnetic Emissions," IEEE Transactions on Electromagnetic Compatibility, vol. 48, Issue 4, Nov. 2006, IEEE, 9 pages.

* cited by examiner

METHOD OF MEASURING ELECTROMAGNETIC SIGNAL AND ELECTRONIC DEVICE THEREFOR

CROSS-REFERENCE TO RELATED APPLICATION

This application is based on and claims priority under 35 U.S.C. 119 to Korean Patent Application No. 10-2019-0002687, filed on Jan. 9, 2019, in the Korean Intellectual Property Office, the disclosure of which is herein incorporated by reference in its entirety.

BACKGROUND

1. Field

The disclosure relates to method of measuring an electromagnetic (EM) signal and an electronic device therefor.

2. Description of Related Art

As the functions of electronic devices, such as mobile phones and the like, develop, electronic devices may provide various functions. For example, a service for controlling an external electronic device (e.g., a television (TV)) using a communication function of the electronic device has been developed. In order to control an external electronic device, the existence and the type of the external electronic device needs to be identified. The existence and the type of the external electronic device may be identified by detecting a signal including identification information.

The above information is presented as background information only to assist with an understanding of the disclosure. No determination has been made, and no assertion is made, as to whether any of the above might be applicable as prior art with regard to the disclosure.

SUMMARY

In order to identify the existence and the type of an external electronic device, a signal including identification information may be used. However, in order for reception of the signal including the identification information, an operation in which the external electronic device generates and transmits a signal is needed. Furthermore, for the operation of generating and transmitting a signal by the external electronic device, a request from the electronic device is needed, and a user needs to run a predetermined application. That is, the user may run an application so as to command transmission of a request signal. In response to the command, the electronic device may transmit the request signal to the external electronic device, and may receive a response signal including identification information from the external electronic device. In order to identify the external electronic device, a technology that uses a unique electromagnetic interference (MEI) or electromagnetic (EM) signal generated from the device may be used.

Various embodiments of the disclosure may provide a method of measuring an electromagnetic signal emitted from an external electronic device, and an electronic device therefor.

In accordance with various embodiments, an electronic device may include: a housing including a first side facing in a first direction, a second side facing in a second direction which is opposite to the first direction, and a lateral member that at least encloses a space between the first side and the second side; a display displayed through at least a part of the first side; a first conductive part disposed in the housing or the space; a second conductive part disposed in the housing or the space, to be spaced from the first conductive part; at least one EM sensing circuit disposed in the housing, electrically or operably connected to the first conductive part or the second conductive part, and configured to sense an electromagnetic signal; at least one wireless communication circuit; a processor disposed in the housing, and operably connected to the display, the EM sensing circuit, and the wireless communication circuit; and a memory operably connected to the processor. The memory may store instructions, which, when executed, enable the processor to: obtain an input signal including an electromagnetic signal of an external electronic device and a self-noise, using the EM sensor; identify an ambient condition of the electronic device; identify a compensation self-noise corresponding to the ambient condition; generate a signal pattern, on the basis of the input signal and the compensation self-noise; and identify the external electronic device, on the basis of on at least a part of the signal pattern.

In accordance with various embodiments, an electronic device may include: a housing including a first side facing in a first direction, a second side facing in a second direction which is opposite to the first direction, and a lateral member that at least encloses a space between the first side and the second side; a display displayed through at least a part of the first side; a first conductive part disposed in the housing or the space; a second conductive part disposed in the housing or the space, to be spaced from the first conductive part; at least one EM sensing circuit disposed in the housing, electrically or operably connected to the first conductive part or the second conductive part, and configured to sense an electromagnetic signal; at least one wireless communication circuit; a processor disposed in the housing, and operably connected to the display, the EM sensing circuit, and the wireless communication circuit; and a memory operably connected to the processor. The memory may include instructions which, when executed, enable the processor to: determine at least one measurement parameter in association with measurement of a self-noise; measure the self-noise according to the at least one measurement parameter; and generate a compensation self-noise on the basis of a result of measurement of the self-noise.

In accordance with various embodiments, an operation method of an electronic device may include: obtaining an input signal including an electromagnetic (EM) signal of an external electronic device and a self-noise using an electromagnetic (EM) sensor; identifying an ambient condition of the electronic device; identifying a compensation self-noise corresponding to the ambient condition; generating a signal pattern on the basis of the input signal and the compensation self-noise; and identifying the external electronic device on the basis of at least a part of the signal pattern.

A method and an electronic device therefor, according to various embodiments may deduct a signal (e.g., noise) other than an electromagnetic signal generated from an external electronic device from a signal including noise and the electromagnetic (EM) signal generated from the external electronic device which is to be measured.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

FIGS. 1 through 17C, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Hereinafter, various embodiments will be described in detail with reference to attached drawings.

Figure 1:
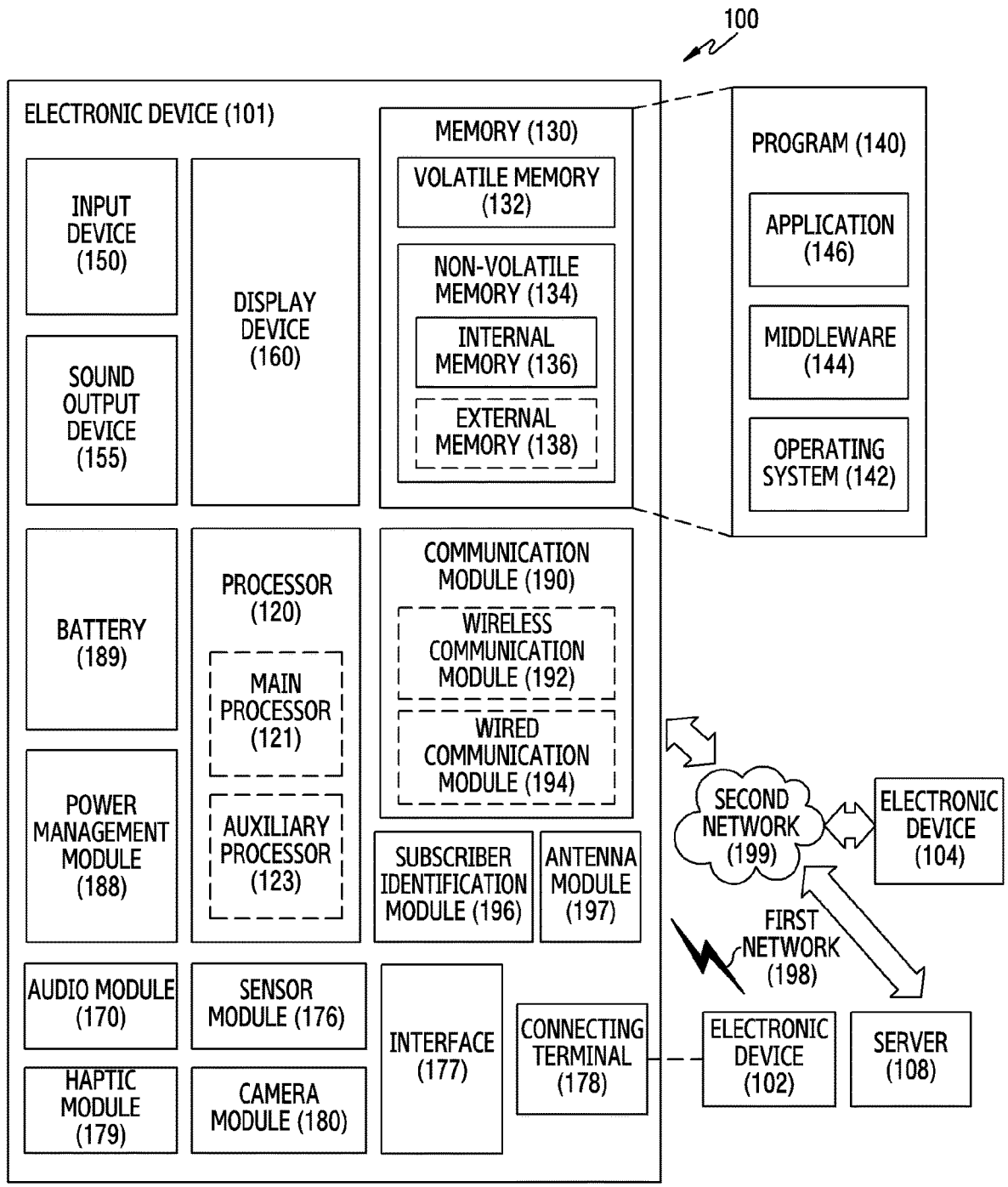
FIG. 1 is a block diagram illustrating an electronic device in a network environment according to various embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB) According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SN), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Various embodiments are provided to measure a unique electromagnetic interference (EMI) or an electromagnetic (EM) signal of an external electronic device, and relate to a method of cancelling a noise from a signal which includes an electromagnetic signal and the noise, and a hardware configuration therefor. That is, various embodiments described below may be related to electromagnetic interference/electromagnetic measurement, noise cancelling, machine learning, big data, classification, determination and/or identification.

Figure 2:
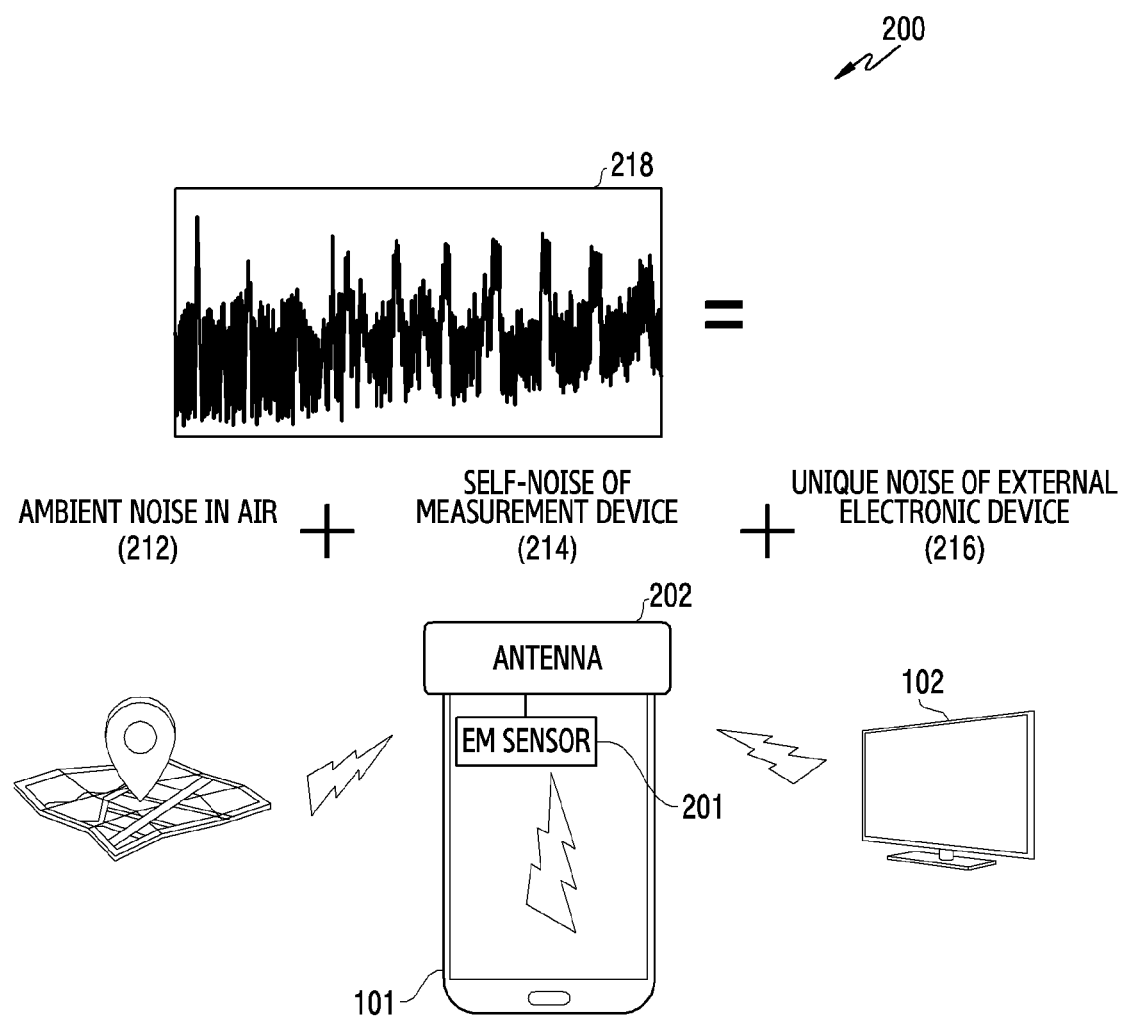
FIG. 2 is a diagram illustrating signal components detected by an EM sensor when an electromagnetic (EM) signal is measured according to various embodiments.

An external electronic device (television (TV), a refrigerator, or a speaker) including an electric circuit may emit an electromagnetic signal in a unique pattern. Accordingly, various technologies that measure an electromagnetic signal emitted from the external electronic device and utilize the measured electromagnetic signal are being studied. To measure an electromagnetic signal, equipment for receiving and analyzing a signal may be used. Hereinafter, in various embodiments, equipment for receiving and analyzing signals may be referred to as an "electromagnetic (EM) sensor", "EM sensing circuit", and "EM measurement unit", or "EM measurement system". In the case of measuring an electromagnetic signal using an EM sensor, a signal is received from the outside of a device corresponding to the target of measurement. Therefore, as illustrated in FIG. 2, a noise existing in the surrounding area (hereinafter, referred to as an "ambient noise") in addition to a desired electromagnetic signal, flows in, and a noise (hereinafter, referred to as a "self-noise") generated from the EM sensor or a device (e.g., the electronic device 101) equipped with the EM sensor may be detected together. Hereinafter, the self-noise may include an electromagnetic signal generated from the EM sensor and the device equipped with the EM sensor.

FIG. 2 is a diagram illustrating signal components detected by an EM sensor when an electromagnetic (EM) signal is measured according to various embodiments. FIG. 2 illustrates the situation in which the electronic device 101 equipped with an EM sensor 201 and an antenna 202 measures an electromagnetic signal emitted from the electronic device 102 (e.g., a TV) which is an external electronic device.

Referring to FIG. 2, an electromagnetic signal of the external electronic device (e.g., the electronic device 102) (e.g., a TV) may be measured using the electronic device 101. Although it is desired to measure only a unique electromagnetic signal of the electronic device 102, a collected signal 218 may include various signals that flow into the antenna 202 installed in the electronic device 101. The signal 218 that flows in may include various types of ambient noises (white noises) 212 floating in the air, a self-noise 214 flowing into the antenna 202 from the electronic components mounted in the electronic device 101, and/or a unique noise 216 of the external electronic device (e.g., the electronic device 102) which corresponds to the purpose of measurement. Here, the unique noise 216 may be an electromagnetic signal that the electronic device desires to measure.

The ambient noise 212 of the electronic device 101 may vary depending on the environment of measurement and the point in time of measurement. Therefore, depending on when or where an electromagnetic signal of the external electronic device (e.g., the electronic device 102) is measured, a resultant measured signal may be different. That is, the uniqueness of the measured signal may not be secured due to the ambient noise 212. Therefore, although corresponding signal is utilized for various application fields (e.g., machine learning, classification, or database (DB) establishment), reliability and accuracy (recognition rate of machine learning) of a result may deteriorate due to a deviation associated with an environment, a deviation associated with a device, and a deviation associated with the point in time of measurement.

Also, the self-noise 214 of the electronic device 101 may vary depending on an internal hardware design structure (e.g., components mounted therein, a printed circuit board (PCB), and/or an antenna (e.g., the antenna 197). Therefore, although the same EM sensor 201 is contained, if the hardware components of a device that performs measurement are different, a resultant measured signal may be different. For example, although a DB is established by measuring an electromagnetic signal of the external electronic device using model A, the DB established using model A may not be used for model B since model B which has a hardware design different from that of the model A generates a different self-noise.

Due to the problems incurred by the above-described noises, there is a desire for a technology of cancelling the ambient noise 212 and the self-noise 214, so as to only obtain the unique noise 216 of a measurement target (e.g., the electronic device 102). As a technology of cancelling a noise, a scheme of separately measuring and storing a predetermined noise, and cancelling the corresponding noise from a signal obtained from a measurement target via post-processing, may be considered. However, since the ambient noise 212 is different depending on a location and the point in time of measurement, it is difficult to specify and store the ambient noise 212. Accordingly, the above-described scheme may be used for cancelling the self-noise 214. Even in the case of cancellation of the self-noise 214, if the phase and frequency of the self-noise 214 varies depending on the point in time of measurement, the previously stored signal may be meaningless data. For example, the cycles of tasks, which are performed as a background in a smart phone, may be different from each other (e.g., a sensor hub 1 Hz and a display 60 Hz). In this instance, if the measurement of an electromagnetic signal is finished during a short period of time (e.g., 0.5 ms), a completely different signal may be collected depending on the point in time of measurement.

Various embodiments described below are to cancel a self-noise from an input signal using a predetermined signal value, so as to collect only a unique electromagnetic signal of a measurement target when an electromagnetic signal of an external electronic device is measured. The predetermined signal value used for cancelling the self-noise is the model of a self-noise which is obtained by processing a measured self-noise. Hereinafter, for ease of description, this is referred to as a "compensation self-noise". According to various embodiments, by collecting only a unique electromagnetic signal of a measurement target, problems (e.g., deterioration of a cognition rate of machine learning) that occur due to a deviation caused by an environment, a device, and/or the point in time of measurement may be overcome.

Figure 3A:
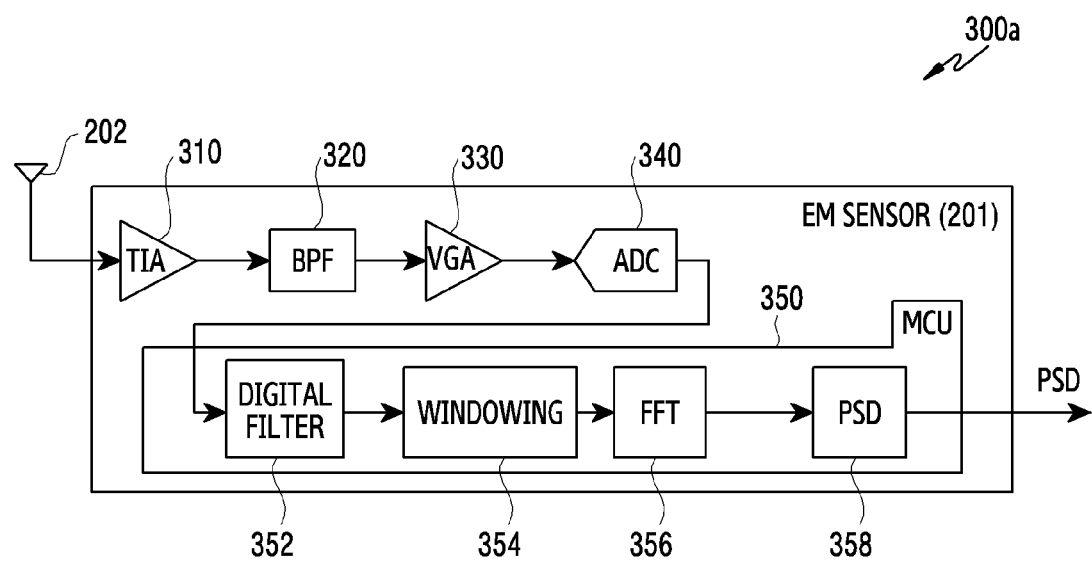
FIG. 3A is a block diagram illustrating an EM sensor according to various embodiments.
Figure 3B:
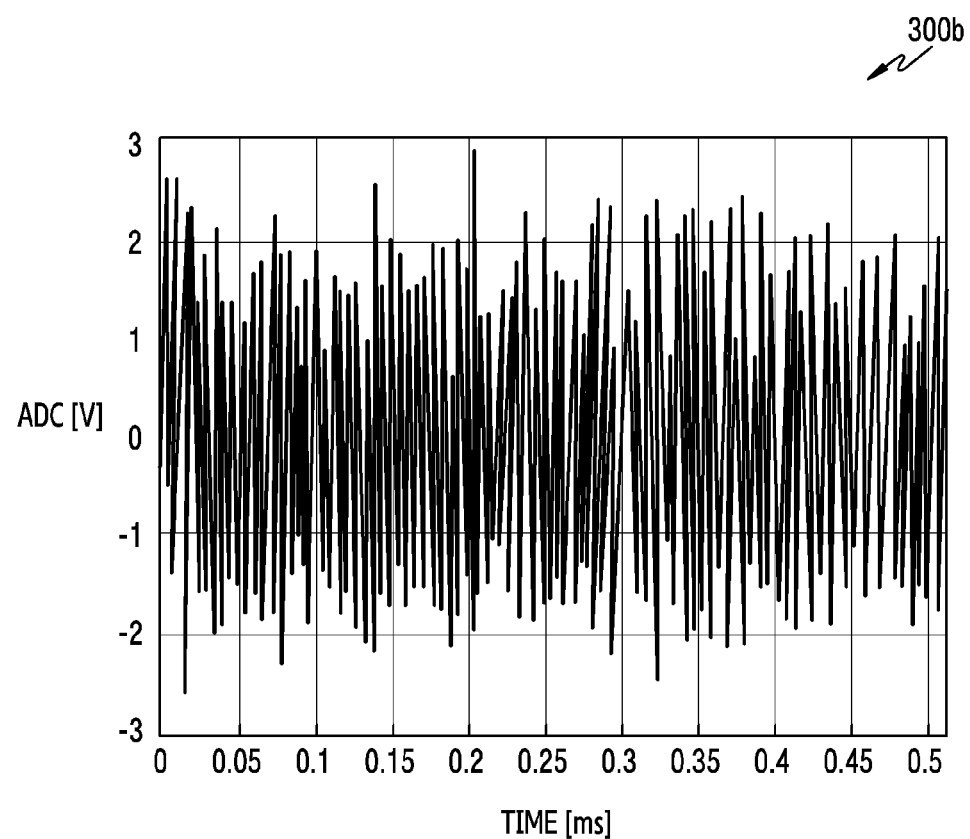
FIG. 3B is a diagram illustrating the time domain of an electromagnetic signal according to various embodiments.
Figure 3C:
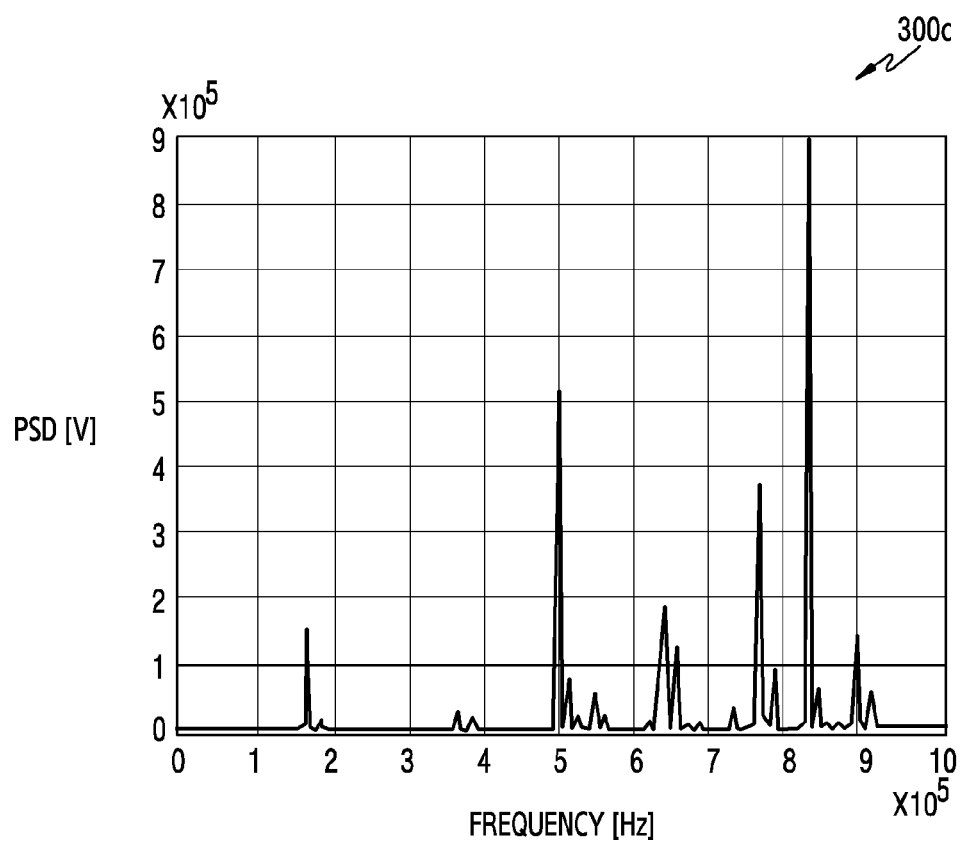
FIG. 3C is a diagram illustrating the frequency domain of an electromagnetic signal according to various embodiments.

FIG. 3A is a block diagram 300a illustrating the EM sensor 201 according to various embodiments. FIG. 3B is a diagram 300b illustrating the time domain of an electromagnetic signal according to various embodiments. FIG. 3C is a diagram 300c illustrating the frequency domain of an electromagnetic signal according to various embodiments.

Referring to FIG. 3A, the EM sensor 201 may include a transimpedance amplifier (TIA) 310, a band pass filter (BPF) 320, a variable gain amplifier (VGA) 330, an analog digital converter (ADC) 340, and/or a micro controller unit (MCU) 350.

The TIA 310 may have a reception bandwidth that allows processing a signal received via the antenna 202. The TIA 310 may amplify a frequency signal which ranges from several KHz to several MHz and is received from the antenna 202. The BPF 320 may filter the signal amplified by the TIA 310 on the basis of a range close to that of a predetermined signal of interest which defines a characteristic pattern. The VGA 330 may output a signal at a predetermined level within a predetermined gain range, in order to improve a noise characteristic of the filtered signal and an external interference signal removal characteristic. The ADC 340 may convert an analog signal of which the gain is controlled by the VGA 330 into a digital signal, and may provide the same to the MCU 350. The above-described TIA 310, BPF 320, VGA 330, and/or ADC 340 are disposed in order to collect detected data associated with an electromagnetic signal according to embodiments. The sequence and/or configuration of the components may be different according to various embodiments.

The MCU 350 may include a digital filter 352, a windowing unit 354, a fast Fourier transform (FFT) unit 356, and/or a power spectrum density (PSD) unit 358. The digital filter 352 may block signal components of an unnecessary band included in a digital signal output from the ADC 340. The windowing unit 354 may decrease the size of the start and the end of a signal in order to suppress generation of a distorted frequency component when the fast Fourier transform (FFT) operation is performed. The FFT unit 356 performs the fast Fourier transform (FFT) operation, so as to convert a signal in the time domain (e.g., the signal 330b of FIG. 3B) into a signal in the frequency domain the signal 330c of FIG. 3C). The PSD unit 358 may calculate a PSD value of a frequency domain signal for each frequency. Through the above-described filtering and signal processing operations, the MCU 350 may obtain detected data associated with an electromagnetic signal, which is refined from the digital signal provided from the ADC 340. According to an embodiment, the MCU 350 may provide a digital signal, provided from the ADC 340, to a higher system. Also, detected data of the time domain is merely a signal of a noise component caused by EMI, and may need to be converted into data of the frequency domain for spectrum analysis. According to an embodiment, the MCU 350 may provide detected data of the time domain to a higher system.

The FFT operation used for converting data of the time domain into data of the frequency domain may be expressed as shown in Equation 1.

$$X_k = \sum_{n=0}^{N} x_n e^{-jw\pi k \frac{n}{N+1}} \qquad \text{Equation 1}$$

In Equation 1, $X_k$ denotes a $k^{th}$ sample of a frequency domain signal, N denotes the number of samples of a time domain signal, and $x_n$ denotes an $n^{th}$ sample of a time domain signal. According to Equation 1, the data of the time domain illustrated in FIG. 3B may be converted into the data of the frequency domain illustrated in FIG. 3B.

Detected data in the time domain may be referred to as "ADC data", and detected data in the frequency domain may be referred to as "PSD" data. For example, the ADC data may be expressed as shown in FIG. 3B, and the PSD data may be expressed as shown in FIG. 3C. The EM sensor 201 may provide ADC data and/or PSD data as output data.

The sequence and/or configuration of a filter for converting the format of detected data and/or a signal processing algorithm, and/or a domain transform algorithm such as FFT, operated in the MCU 530, may be changeable. A series of processes or a few processes processed in the MCU 350 according to various embodiments may be performed in the processor in the MCU 350 and/or another processor (e.g., the processor 120) of a higher system, in parallel or separately. The processor according to various embodiments is not limited to the above-described processors.

The EM sensor 201 which has been described with reference to FIGS. 3A to 3C are capable of operating as an independent single sensor or module, and may be implemented as a circuit block integrally or partly included in a predetermined device (e.g., the electronic device 101). For example, at least a part of the EM sensor may be a part of the components of the electronic device 101, and particularly, may be a part of the processor 120.

Figure 4:
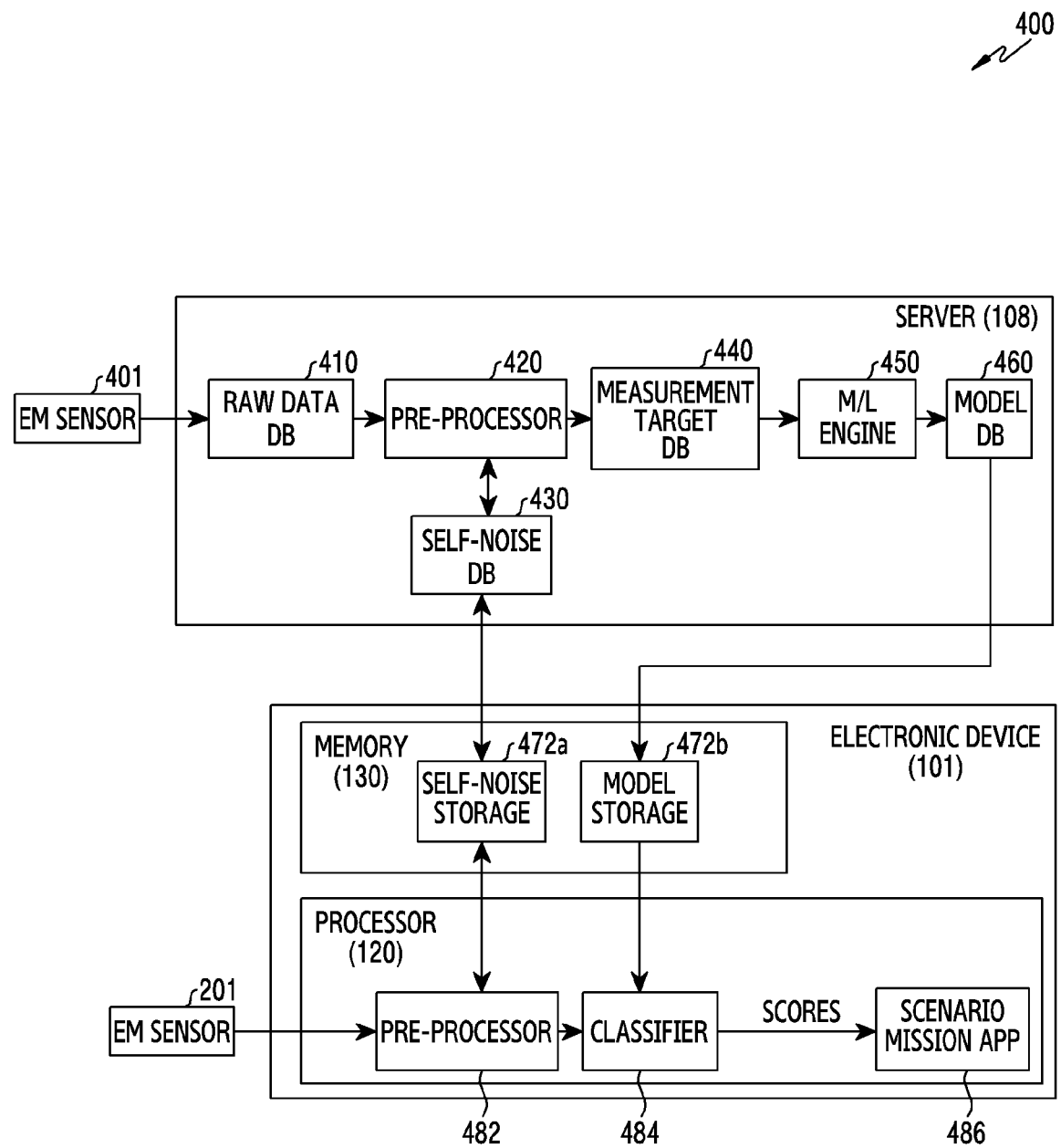
FIG. 4 is a diagram illustrating an example of a system for identifying an external electronic device using an electromagnetic signal according to various embodiments.

FIG. 4 is a diagram illustrating an example of a system 400 for identifying an external electronic device using an electromagnetic signal according to various embodiments. FIG. 4 illustrates the system 400 including the server 108 that performs machine learning using a measured electromagnetic signal, and the electronic device 101 that uses the result of machine learning.

Referring to FIG. 4, ADC data and/or PSD data output from the EM sensor 201 may be used by a machine learning (MIL) engine 450 for generating a learning model, and may be used for classifying, determining, and/or identifying an external electronic device (e.g., the electronic device 102) neighboring to the electronic device 101.

The server 108 may include a raw data database (DB) 410, a pre-processor 420, a self-noise DB 430, a measurement target DB 440, a machine learning engine (M/L engine) 450, and/or a model DB 460. The raw data DB 410 may store a unique electromagnetic signal of a predetermined external electronic device provided from an EM sensor 401, or a self-noise signal of an electronic device (e.g., the electronic device 101), as big data. The EM sensor 401 may be configured to be the same as the EM sensor 201. According to an embodiment, the pre-processor 420 may convert detected data collected in the raw data DB 410 into data in the format appropriate for machine learning. According to an embodiment, the pre-processor 420 may process a self-noise signal, so as to generate self-noise data including a compensation self-noise. The self-noise DB 430 may store self-noise data. The measurement target DB 440 may store a unique electromagnetic signal of an external electronic device which is converted by the pre-processor 420. The machine learning engine 450 may perform learning using detected data, and may generate the model of an electromagnetic signal for each device. The model DB 460 may store learning model data including information associated with unique signals of external electronic device provided after machine learning or unique signals of external electronic devices set in advance. For example, the learning model data may include a look-up table including regenerated items for match of predetermined values of unique signals so that a corresponding program may get fast access. The above-described series of processes performed by the server 108 may be processed by various devices and/or system, in parallel or separately. For example, the processes may be processed by at least one of a local drive, an internal system of a device and a memory, an external system, a cloud, a portable communication device (e.g., a smart phone), a computer device, a portable multimedia device, a portable medical device, a camera, a wearable device, or electric appliance, in parallel or separately.

The electronic device 101 may include the processor 120 and the memory 130. The memory 130 may include a model storage 472b. The processor 120 may include a pre-processor 482, a classifier 484, a scenario mission application 486. Self-noise data stored in the self-noise DB 430 of the server 108 and/or learning model data stored in the model DB 460 may be delivered to the electronic device 101 which desires to identify an external electronic device. The self-noise data may be downloaded and stored in the self-noise storage 472a of the memory 130 periodically or in response to a request, and the learning model data may be downloaded and stored in the model storage 472b of the memory 130 periodically or in response to a request. The pre-processor 482 may convert the detected data associated with an electromagnetic signal of the external electronic device which is provided from the EM sensor 201, to data in the format appropriate for classification. The classifier 484 may match detected data provided from the pre-processor 482 to a model having a similar waveform by performing a matching operation with respect to predetermined values of unique signals included in the learning model data stored in the model storage 472b. For example, the classifier 484 may output a table of scores (e.g., generalized method of moments (GMM) points) indicating the degree of similarity between detected electromagnetic data of a neighboring external electronic device and unique signals of various models stored in an embedded memory. For example, if a user brings the electronic device 101 including the classifier 484 close to a TV, and learning model data of a TV, a laptop computer, a phone, and/or a smart watch are stored in the embedded memory 130 of the electronic device 101, the classifier 484 may output a score table including 5.2 points for the TV, 1.5 points for the laptop, 0.8 points for the phone, and 0.4 points for the smart watch. Through the above, the electronic device 101 may determine that the external electronic device is a TV. The scenario mission application 486 may perform a corresponding function using information associated with the identified external electronic device, and may provide various convenience functions to the user.

In the machine learning system 400 of FIG. 4, the EM sensor 201 is illustrated as a device separate from the electronic device 101. However, the EM sensor 201 may be disposed inside the electronic device 101. According to an embodiment, at least a part of the EM sensor 201 may be included in the processor 120.

Figure 5:
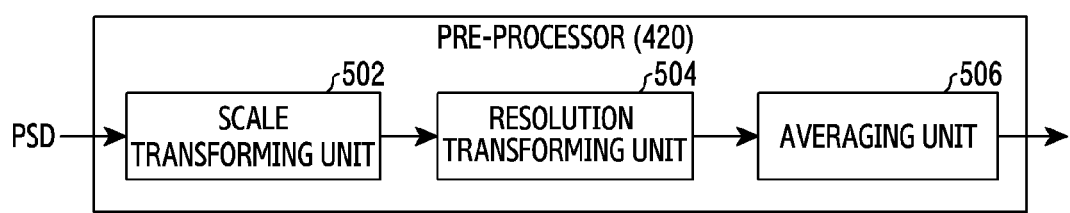
FIG. 5 is a block diagram illustrating a pre-processor according to various embodiments.

FIG. 5 is a block diagram 500 illustrating the pre-processor 420 according to various embodiments. Referring to FIG. 5, the pre-processor 420 may include a scale converter 502, a sample count adjuster 504, and/or an averaging unit 506. The scale converter 502 may convert PSD values into values expressed on the log scale. The sample count adjuster 504 may adjust the number of samples of PSD values. For example, the sample count adjuster 504 may change N samples to one sample in order to reduce the amount of operations, and one sample may have the maximum value, the minimum value, or the average value of the N samples. The averaging unit 506 may equalize PSD values. For example, the averaging unit 506 may perform an averaging operation in order to remove an unnecessary noise component.

Figure 6:
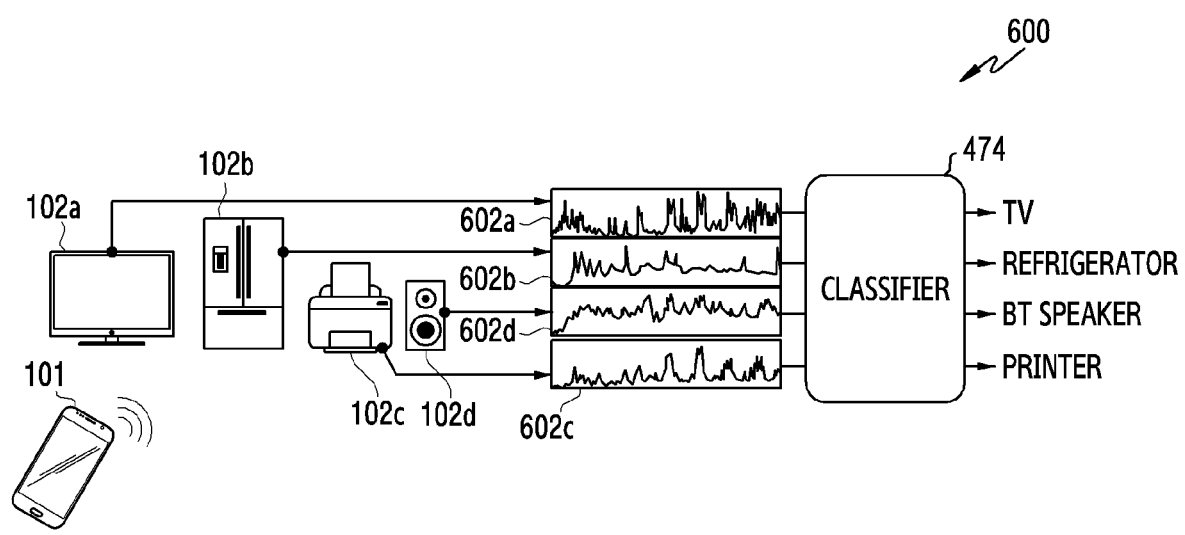
FIG. 6 is a conceptual diagram illustrating an identification operation by a device using an electromagnetic signal according to various embodiments.

FIG. 6 is a conceptual diagram 600 illustrating an identification operation by a device using an electromagnetic signal according to various embodiments.

Referring to FIG. 6, a plurality of external electronic devices may be placed around the electronic device 101. For example, the external electronic devices may include a TV 102a, a refrigerator 102b, a printer 102c, and/or a Bluetooth speaker 102d. According to an embodiment, the external electronic devices may include various components therein, and an electromagnetic signal 602a, 602b, 602c, or 602d generated from the components may include various frequency signals. For example, an electromagnetic signal may include unique signals ranging from several KHz to several MHz. If the electronic device 101 approaches to one of the external electronic devices, the electronic device 101 may detect a unique signal associated with electromagnetic interference via the EM sensor 201 and the antenna 202, and may identify or classify the corresponding external electronic device using the detected signal. According to an embodiment, information associated with the identified external electronic device may be displayed on a display (e.g., the display device 160) of the electronic device 101. According to an embodiment, the information associated with the identified external electronic device may be acoustically output.

The electronic device 101 may include a memory (e.g., the memory 130) in which model data (e.g., a look-up table) including unique signals corresponding to various external electronic devices is stored. However, various embodiments are not limited thereto, and the model data may be stored in an external server (e.g., the server 108) that is capable of performing communication with the electronic device 101 via a network. The electronic device 101 may perform comparison with a detected electromagnetic signal of an external electronic device via communication with the external server. In this instance, the electronic device 101 may transmit information associated with the detected electromagnetic signal to the external server, and may receive matched identification information of an external electronic device from the external server.

The electronic device 101 may run a predetermined application on the basis of the identification information of the external electronic device. For example, if the external electronic device is identified as a TV, the electronic device 101 may automatically run an application related to a remote controller, and may establish a connection to the TV Accordingly, a user only needs to bring the electronic device 101 close to an external electronic device in order to enable the external electronic device to be in a state (on standby) in which the user can control the external electronic device, and convenience for users may be improved.

Figure 7:
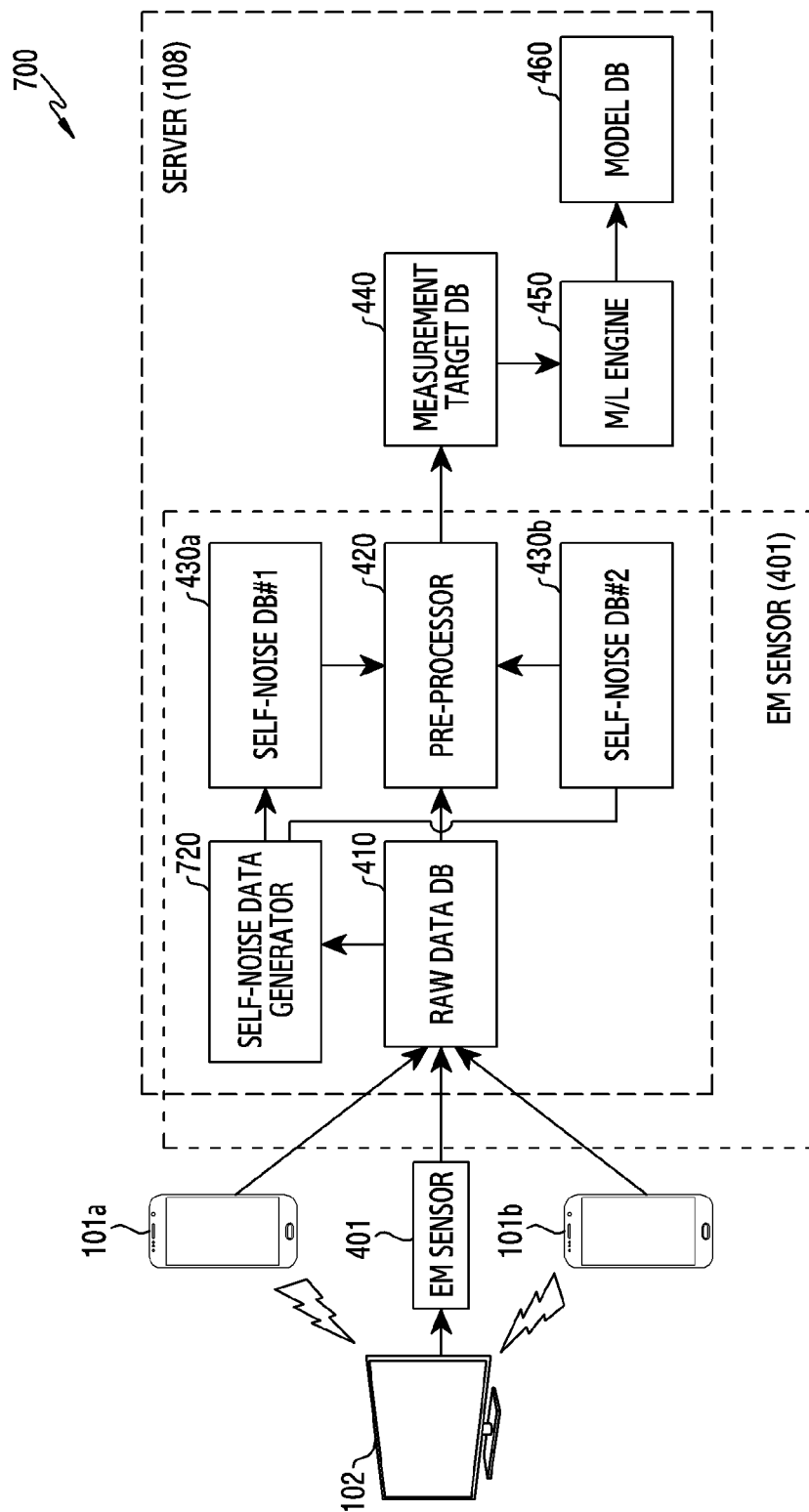
FIG. 7 is a diagram illustrating an example of a system for establishing a self-noise DB for each device according to various embodiments.

FIG. 7 is a diagram illustrating an example of a system 700 for establishing a self-noise DB for each device according to various embodiments. FIG. 7 illustrates the system 700 that generates self-noise data corresponding to each of electronic devices 101a and 101b using raw data collected from the electronic device 101a and 101b having different structures, and stores an electromagnetic signal model of a measurement target (e.g., the electronic device 102) from which a self-noise is canceled.

Referring to FIG. 7, each of the first electronic device 101a and the second electronic device 101b may measure an electromagnetic signal emitted from an external electronic device (e.g., the electronic device 102). The first electronic device 101a and the second electronic device 101b, which are devices of different models, may have different structures, and may generate different self-noises.

The first electronic device 101a may measure a noise (e.g., a self-noise and/or ambient noise) using an antenna of the first electronic device 101a. For example, the first electronic device 101a may detect an electromagnetic signal during a predetermined period of time (during at least a predetermined period of time) using the antenna of the first electronic device 101a. Raw data associated with a noise measured by the first electronic device 101a may be provided to the raw data. DB 410 of the server 108. Raw data associated with the noise stored in the raw data DB 410 may be provided to a self-noise data generator 720. The self-noise data generator 720 may identify a characteristic of a noise measured by the first electronic device 101a (e.g., a time slot in which measurement is performed, a frequency characteristic, and/or the number of repetitions) and may identify information associated with the first electronic device 101a that performs measurement and/or an ambient condition when the measurement is performed (e.g., whether an external power source is connected, an activated component, an application that is running in the foreground, and/or an application that is running in the background). The self-noise data generator 720 may generate self-noise data of the first electronic device 101a which corresponds to the ambient condition, and may provide the same to the self-noise DB11 430a.

The second electronic device 101b may measure a noise (e.g., a self-noise and/or ambient noise) using an antenna of the second electronic device 101b. For example, the second electronic device 101b may detect an electromagnetic signal during a predetermined period of time (during at least a predetermined period of time) using the antenna of the second electronic device 101b. Raw data associated with a noise measured by the second electronic device 101b may be provided to the raw data DB 410 of the server 108. Raw data associated with the noise stored in the raw data DB 410 may be provided to the self-noise data generator 720. The self-noise data generator 720 may identify a characteristic of a noise measured by the second electronic device 101b (e.g., a time slot in which measurement is performed, a frequency characteristic, and/or the number of repetitions), and may identify information associated with the second electronic device 101b that performs measurement and/or an ambient condition when the measurement is performed (e.g., whether an external power source is connected and/or an activated component). The self-noise data generator 720 may generate self-noise data of the second electronic device 101b which corresponds to the ambient condition, and may provide the same to the self-noise DB12 430b.

The pre-processor 420 may obtain self-noise data of an electronic device (e.g., the first electronic device 101a or the second electronic device 101b) from the self-noise DB 11 430a or the self-noise DB 12 430b. The pre-processor 420 may process (e.g., scale conversion, adjustment of the number of samples, and/or averaging) raw data of a signal which includes an electromagnetic signal of an external electronic device (e.g., the electronic device 102) provided from the EM sensor 401, and may cancel the self-noise of the first electronic device 101a or the second electronic device 101b using the self-noise data obtained from the self-noise DB11 430a or the self-noise DB12 430b.

The measurement target DB 440 may store a unique electromagnetic signal of an external electronic device which excludes a self-noise and is provided from the pre-processor 420. The machine learning engine 450 may perform learning using detected data, and may generate a model of an electromagnetic signal for each device. The model DB 460 may store learning model data including information associated with unique signals of external electronic devices provided after machine learning or unique signals of external electronic devices set in advance.

The raw data DB 410, the self-noise DB11 430a, the self-noise DB12 430b, the pre-processor 420, and/or the self-noise data generator 720 in the system 700 of FIG. 7 have been described as components of the server. According to an embodiment, the raw data DB 410, the self-noise DB11 430a, the self-noise DB12 430b, the pre-processor 420, and/or the self-noise data generator 720 may be the components of the EM sensor 401. Data stored in the raw data DB 410, the self-noise DB11 430a, or the self-noise DB12 430b may be stored in a memory (e.g., the memory 130) of an electronic device.

Figure 8:
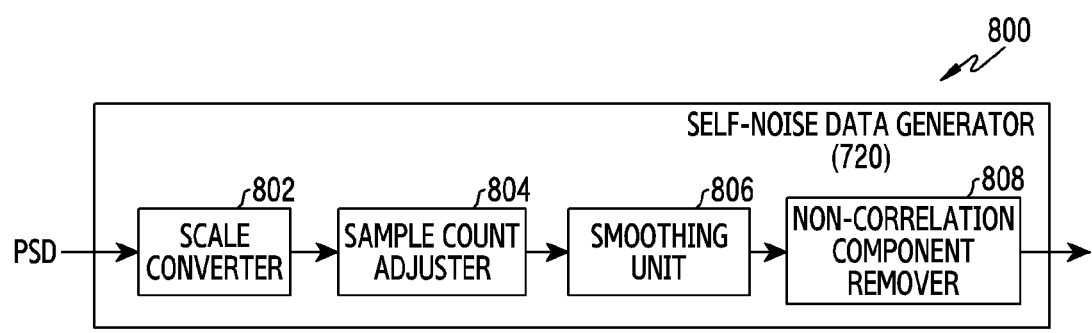
FIG. 8 is a block diagram illustrating a self-noise data generator according to various embodiments.

FIG. 8 is a block diagram 800 illustrating the self-noise data generator 720 according to various embodiments. Referring to FIG. 8, the self-noise data generator 720 may include a scale converter 802, a sample count adjuster 804, a smoothing unit 806, and/or non-correlation component remover 808. The scale converter 802 may convert PSD values included in the raw data of a self-noise to values expressed on a log scale. The sample count adjuster 804 may adjust the number of samples of PSD values. For example, the sample count adjuster 804 may change N samples to one sample in order to reduce the amount of operations, and one sample may have the maximum value, the minimum value, or the average value of the N samples. The smoothing unit 806 may equalize signal values measured at different points in time. For example, the smoothing unit 806 may equalize signal values using an averaging operation. The non-correlation component remover 808 may remove a frequency component which has a low reproducibility.

The self-noise data generator 720 of FIG. 8 may be included in a server (e.g., the server 108). According to various embodiments, the self-noise data generator 720 of FIG. 8 may be included in an electronic device (e.g., the electronic device 101). If the self-noise data generator 720 is included in the electronic device, the electronic device may generate self-noise data, and may store the same in a storage (e.g., the self-noise storage 472a). If the self-noise data is incurred by the electronic device, the self-noise data may be transferred from the self-noise storage 472a to the self-noise DB 430.

Figure 9:
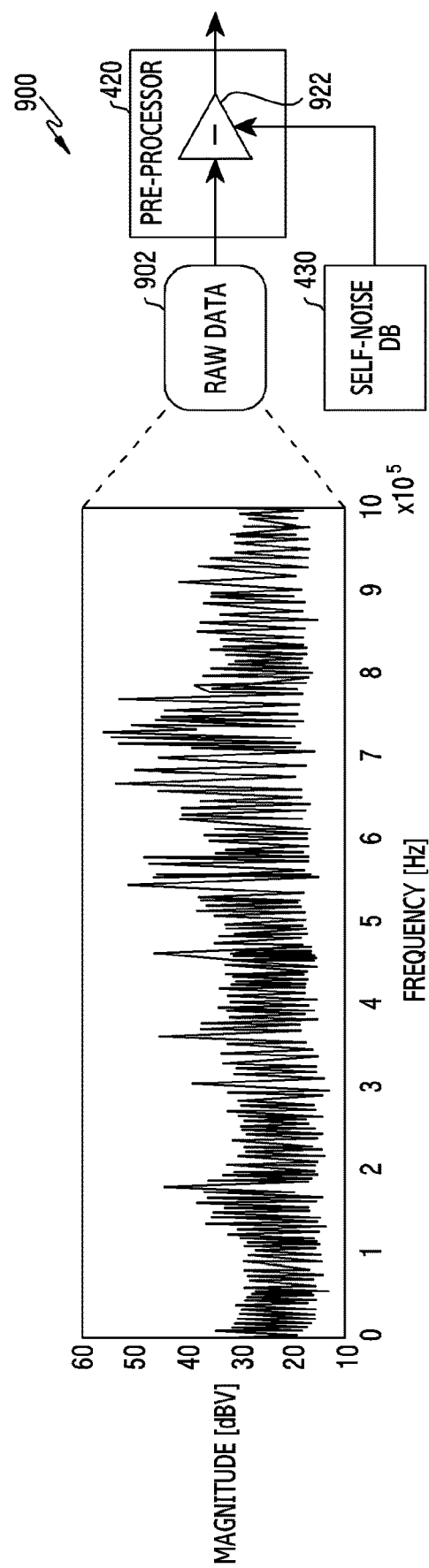
FIG. 9 is another block diagram illustrating a pre-processor according to various embodiments.

FIG. 9 is a block diagram 900 illustrating the pre-processor 420 according to various embodiments. Referring to FIG. 9, the pre-processor 420 may include a deduction unit 922.

The raw data 902 is a result obtained when the EM sensor (e.g., the EM sensor 401) performs measurement with respect to an external electronic device (e.g., the electronic device 102), and may include signal size values in a given frequency range. The pre-processor 420 may obtain raw data 902, may obtain self-noise data from the self-noise DB 430, and may deduct a self-noise from the raw data 902 using the deduction unit 922, so as to output an electromagnetic signal from which a self-noise is canceled.

The pre-processor 420 of FIG. 9 may be included in a server (e.g., the server 108). According to an embodiment, the deduction unit 922 of FIG. 9 may be included in a pre-processor (e.g., the pre-processor 482) of an electronic device (e.g., the electronic device 101). If the deduction unit 922 is included in the pre-processor of the electronic device, the electronic device may remove a self-noise of the electronic device from a signal measured by the electronic device, using the deduction unit 922.

According to various embodiments, an electronic device the electronic device 101) may include: a housing including a first side facing in a first direction, a second side facing in a second direction which is opposite to the first direction, and a lateral member that at least encloses a space between the first side and the second side; a display (e.g., the EM sensor 201) displayed through at least a part of the first side; at least one EM sensor (e.g., the EM sensor 201) disposed in the housing or the space, and configured to sense an electromagnetic (EM) signal; a processor (e.g., the processor 120) disposed in the housing, and operably connected to the display and the EM sensor; and a memory (e.g., the memory 130) operably connected to the processor. The memory stores instructions, which, when executed, enable the processor to: obtain an input signal including an electromagnetic signal of an external electronic device and a self-noise, using the EM sensor; identify an ambient condition of the electronic device; identify a compensation self-noise corresponding to the ambient condition; generate a signal pattern on the basis of the input signal and the compensation self-noise; and identify the external electronic device on the basis of at least a part of the signal pattern.

According to various embodiments, the ambient condition may include at least one of whether an external power source is connected or whether another module is activated.

According to various embodiments, the instructions may enable the processor (e.g., the processor 120) to deduct the compensation self-noise from the input signal, so as to generate the signal pattern.

According to various embodiments, the instructions may enable the processor (e.g., the processor 120) to: determine that the compensation self-noise needs updating; measure the self-noise; and update the compensation self-noise on the basis of a result of measurement of the self-noise.

According to various embodiments, the instructions enable the processor (e.g., the processor 120) to determine whether the compensation self-noise needs updating, on the basis of a record of results of identification of the external electronic device using the compensation self-noise.

According to various embodiments, the instructions enable the processor (e.g., the processor 120) to set a sampling rate for the measurement, a number of repetitions, or a measurement duration, to be greater than a value used when a currently stored compensation self-noise is generated.

According to various embodiments, for the generation of the compensation self-noise, the instructions enable the processor (e.g., the processor 120) to: obtain a plurality of measured signals; remove a time-varying component from the plurality of measured signals; and generate an average signal of signals from which the time-varying component is removed.

According to various embodiment, for removing the time-varying component, the instructions enable the processor (e.g., the processor 120) to: obtain average signals by performing sliding window averaging with respect to the plurality of measured signals; and remove a few average signals having a correlation less than or equal to a reference among the average signals.

According to various embodiments, an electronic device (e.g., the electronic device 101) may include: a housing including a first side facing in a first direction, a second side facing in a second direction which is opposite to the first direction, and a lateral member that at least encloses a space between the first side and the second side; a display (e.g., the display device 160) displayed through at least a part of the first side; at least one EM sensor (e.g., the EM sensor 201) disposed in the housing or the space, and configured to sense an electromagnetic (EM) signal; a processor (e.g., the processor 120) disposed in the housing and operably connected to the display and the EM sensor; and a memory (e.g., the memory 130) operably connected to the processor; wherein the memory includes instructions, which, when executed, enable the processor to: determine at least one measurement parameter in association with measurement of a self-noise; measure the self-noise according to the at least one measurement parameter; and generate a compensation self-noise on the basis of a result of measurement of the self-noise.

According to various embodiments, the instructions enable the processor (e.g., the processor 120) to: identify an ambient condition when measuring the self-noise; and store information associated with the ambient condition together with the compensation self-noise.

According to various embodiments, the at least one measurement parameter includes at least one of a sampling rate, a number of repetitions, or a measurement duration.

According to various embodiments, the instructions enable the processor (e.g., the processor 120) to set the sampling rate, the number of repetitions, or the measurement duration according to a required accuracy.

According to various embodiments, for the generation of the compensation self-noise, the instructions enable the processor (e.g., the processor 120) to: obtain a plurality of measured signals; remove a time-varying component from the plurality of measured signals; and generate an average signal of the signals from which the time-varying component is removed.

According to various embodiments, for removing the time-varying component, the instructions enable the processor (e.g., the processor 120) to: obtain average signals by performing sliding window averaging with respect to the plurality of measured signals; and remove a few average signals having a correlation greater than or equal to a reference among the average signals.

Figure 10:
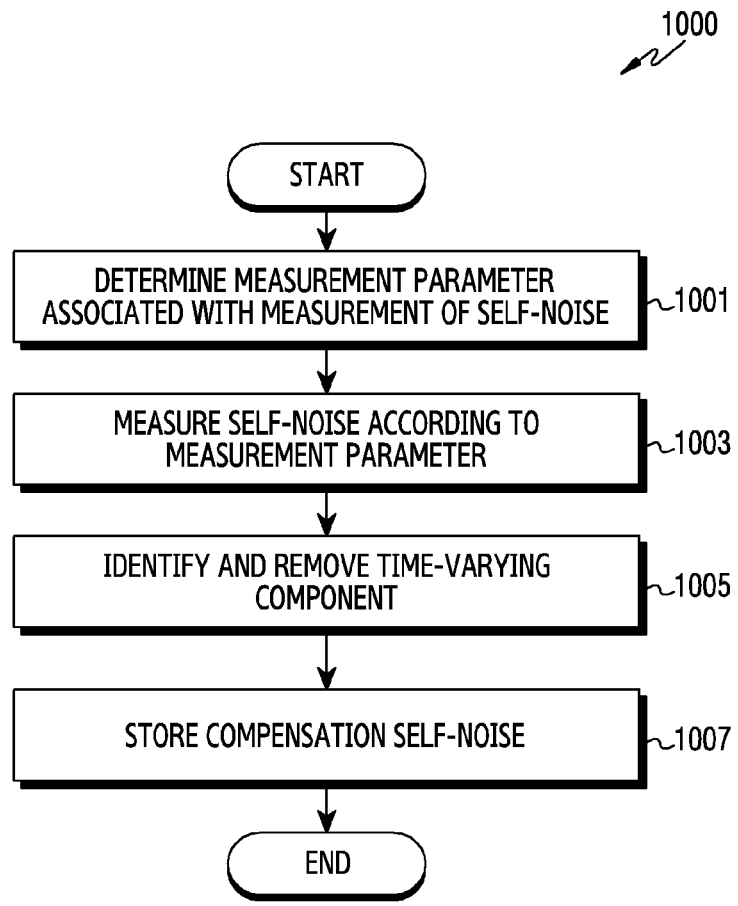
FIG. 10 is a flowchart illustrating a process of generating self-noise data by an electronic device according to various embodiments.

FIG. 10 is a flowchart 1000 illustrating a process of generating self-noise data by an electronic device according to various embodiments. A subject that operates according to the flowchart 1000 of FIG. 10 may be understood as the electronic device 101 or a component (e.g., the processor 120 or the EM sensor 201) of the electronic device 101. The flowchart 1000 of FIG. 10 illustrates operations of generating self-noise data by an electronic device. According to an embodiment, the operations may be performed by a server (e.g., the server 108).

Referring to FIG. 10, in operation 1001, the electronic device 101 (e.g., the processor 120 or the EM sensor 201) may determine at least one measurement parameter for measuring a self-noise. For example, at least one measurement parameter is at least one tuning factor applied to a measurement operation, and may include a sampling rate, the number of repetitions, and/or a measurement duration. The sampling rate is the number of samples of a measured signal per unit time. As a sampling rate is higher, the frequency range of a measurement result is wider. As the number of repetitions increases, the number of signals used for generating a compensation self-noise may increase. The measurement duration is the length of a time spent on measurement performed once. As the measurement duration increases, the amount of time spent on measurement performed once increases, and the upper limit of the period of a detectable noise may increase. According to an embodiment, the electronic device 101 may set a sampling rate, the number of repetitions, the measurement duration according to a required accuracy. For example, as it is required to obtain more accurate self-noise data, the electronic device 101 may increase a sampling rate, increase the number of repetitions, or increase the measurement duration.

In operation 1003, the electronic device 101 may measure a self-noise according to at least one measurement parameter. The electronic device 101 performs measurement according to at least one determined measurement parameter, and may obtain at least one measured signal. For example, the electronic device 101 performs measurement as many times as the number of repetitions during a period of time corresponding to the measurement duration, and may perform digitalization according to the sampling rate.

In operation 1005, the electronic device 101 may identify and remove a time-varying component. In order to obtain self-noise data having a high reproducibility, the electronic device 101 may identify and remove a time-varying component, which is temporarily generated, from measured signals. The time-varying component may be identified by comparing a plurality of signals measured at different points in time.

In operation 1007, the electronic device 101 may store a compensation self-noise. The electronic device 101 may store the self-noise data, from which a time-varying component is removed, as a compensation self-noise. The compensation self-noise may be stored in a memory (e.g., the memory 130).

According to the embodiment which has been described with reference to FIG. 10, the electronic device 101 may generate self-noise data, and may store the same as a compensation self-noise. According to an embodiment, the compensation self-noise may be classified as an ambient condition of the electronic device 101. The ambient condition is a combination of factors that may affect a self-noise of the electronic device 101, and may include, for example, at least one of whether an external power source (e.g., a travel adaptor (TA)) is connected or whether another module (e.g., a display, a camera, and/or a communication module) is activated. For example, a plurality of compensation self-noises, which are in one-to-one relationship with a plurality of different ambient conditions, may be defined. To define a compensation self-noise for each ambient condition, the electronic device 101 may perform the operations of FIG. 10 repeatedly as many times as the number of ambient conditions. The electronic device 101 may identify an ambient condition when measurement is performed, and may store a generated compensation self-noise together with information associated with the ambient condition.

Figure 11:
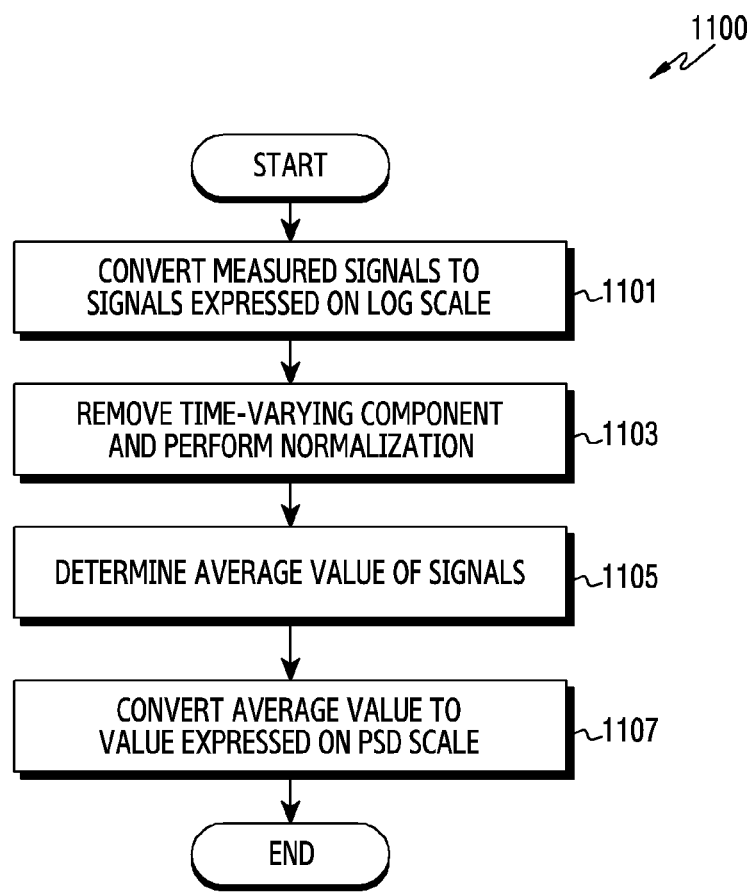
FIG. 11 is a flowchart illustrating a process of generating a compensation self-noise by an electronic device according to various embodiments.

FIG. 11 is a flowchart 1100 illustrating a process of generating a compensation self-noise by an electronic device according to various embodiments. FIG. 12A to FIG. 12F are diagrams illustrating a process of modification of a signal in order to generate a compensation self-noise according to various embodiments. A subject that operates according to the flowchart 1100 of FIG. 11 may be understood as the electronic device 101 or a component (e.g., the processor 120 or the EM sensor 201) of the electronic device 101. The flowchart 1100 of FIG. 11 illustrates operations of generating self-noise data by an electronic device. According to an embodiment, the operations may be performed by a server (e.g., the server 108).

Figure 12A:
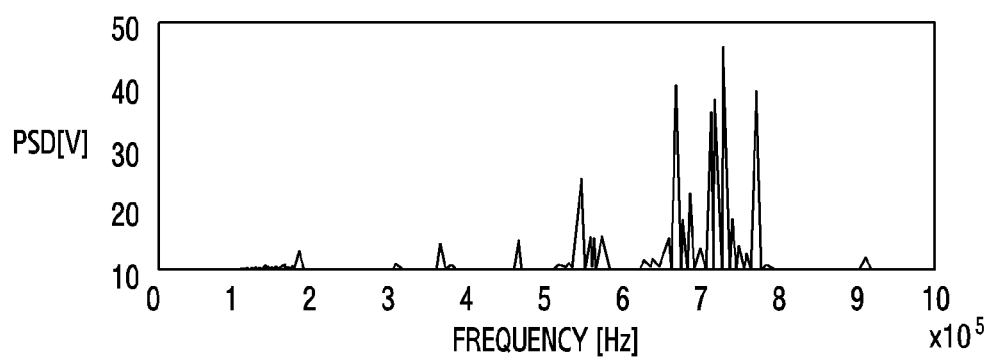
FIGS. 12A to 12F are diagrams illustrating a process of modification of a signal in order to generate a compensation self-noise according to various embodiments.
Figure 12B:
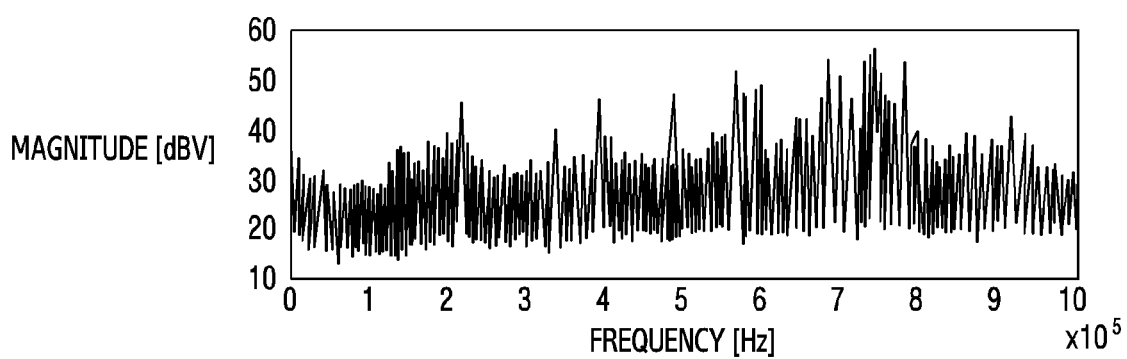

Referring to FIG. 11, in operation 1101, the electronic device 101 (e.g., the processor 120 or the EM sensor 201) may convert measured signals to signals expressed on a log scale. For example, a measured signal is as shown in FIG. 12A, and a signal expressed on a log scale after conversion is as shown in FIG. 12B. FIG. 12A and FIG. 12B are graphs on which measured signals, obtained by measurement performed approximately 200 times, are plotted overlappingly. FIG. 12A expresses signals on a PSD scale, and FIG. 12B expresses signals on the log scale. Since the measured signals are converted to log scale signals as shown in FIG. 12B, the measured signals may be expressed in the form that allows easy comparison of size of signals in the entire frequency range.

Figure 12C:
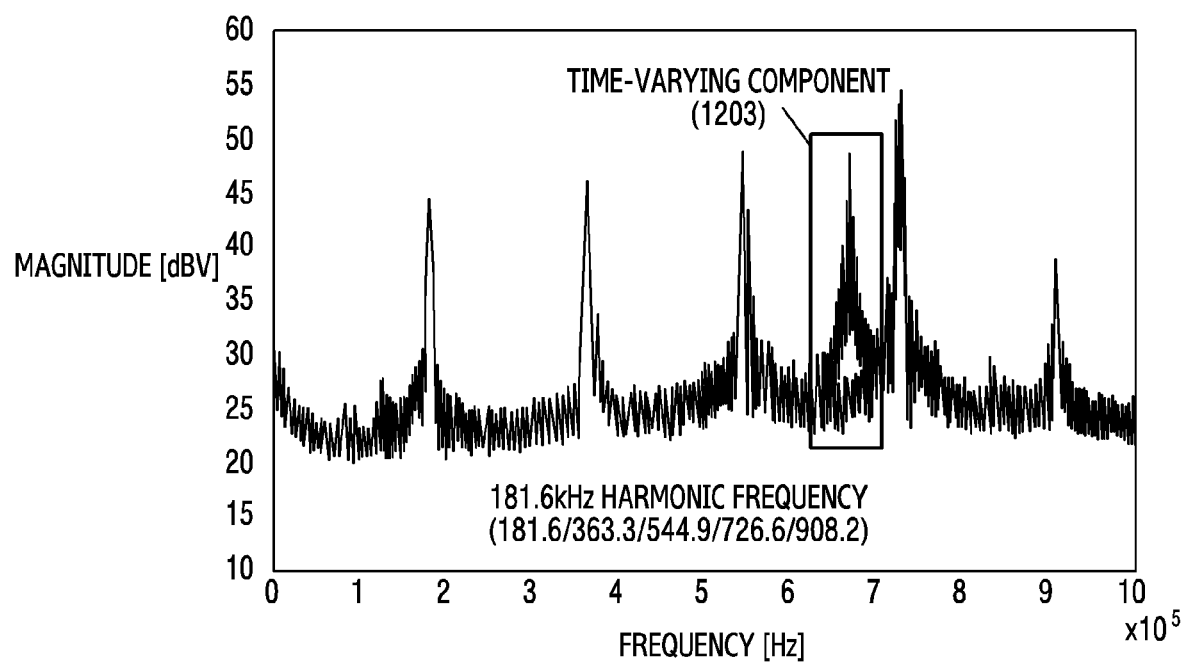
Figure 12D:
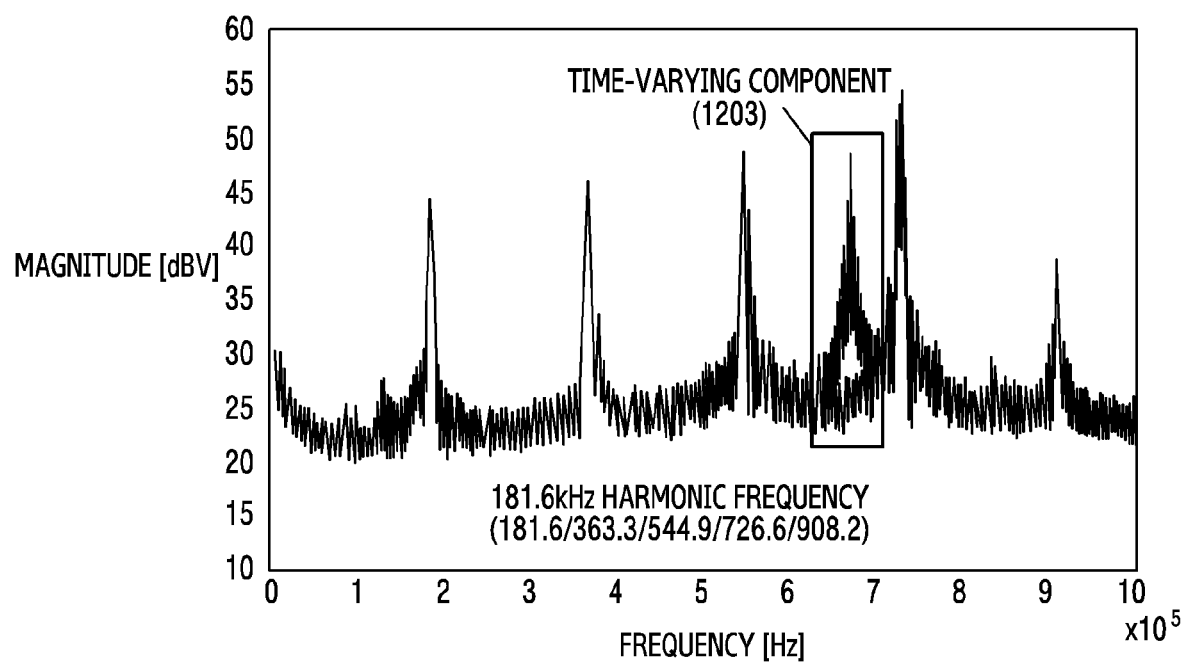

In operation 1103, the electronic device 101 may remove a time-varying component and may perform normalization. Referring to FIG. 12C, approximately 5 peak components are observed. Among them, a fourth peak component 1203 is a component having a deviation in level depending on the point in time of measurement, which may be observed from some of the measured signals. The electronic device 101 may determine a component (e.g., the fourth peak component 1203 at around 668 kHz) observed from some of the measured signals as a time-varying component, and may remove the time-varying component. A result obtained after removing the time-varying component may be as shown in FIG. 12B. The signal from which the time-varying component is removed, as shown in FIG. 12D, may mainly include a non-time varying signal having a high reproducibility, for example, 181.6, 363.3, 544.9, 726.6, and 908.2 kHz signals, which are harmonic frequencies of 181.6 kHz. The electronic device 101 may normalize signals from which the time-varying component is removed, via smoothing or averaging.

Figure 12E:
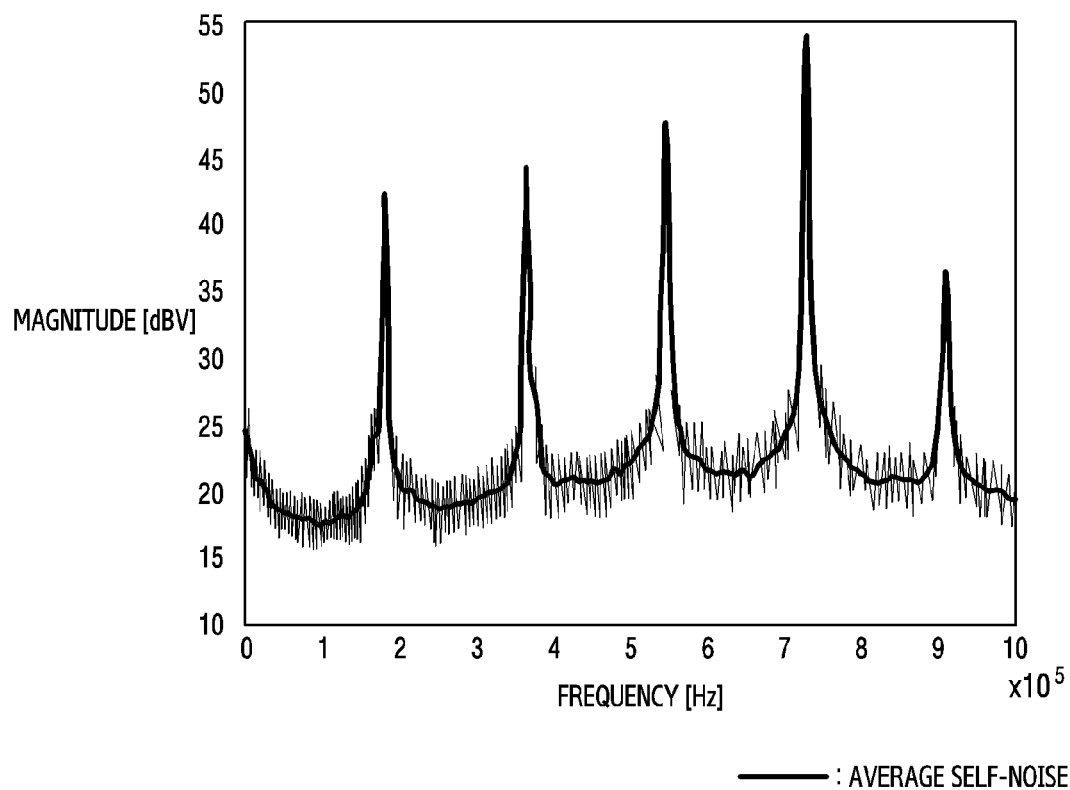

In operation 1105, the electronic device 101 may determine the average value of signals. The electronic device 101 may average a plurality of measured signals in order to determine one representative noise signal from among the plurality of measured signals. For example, as shown in FIG. 12E, the electronic device 101 may determine an average self-noise.

Figure 12F:
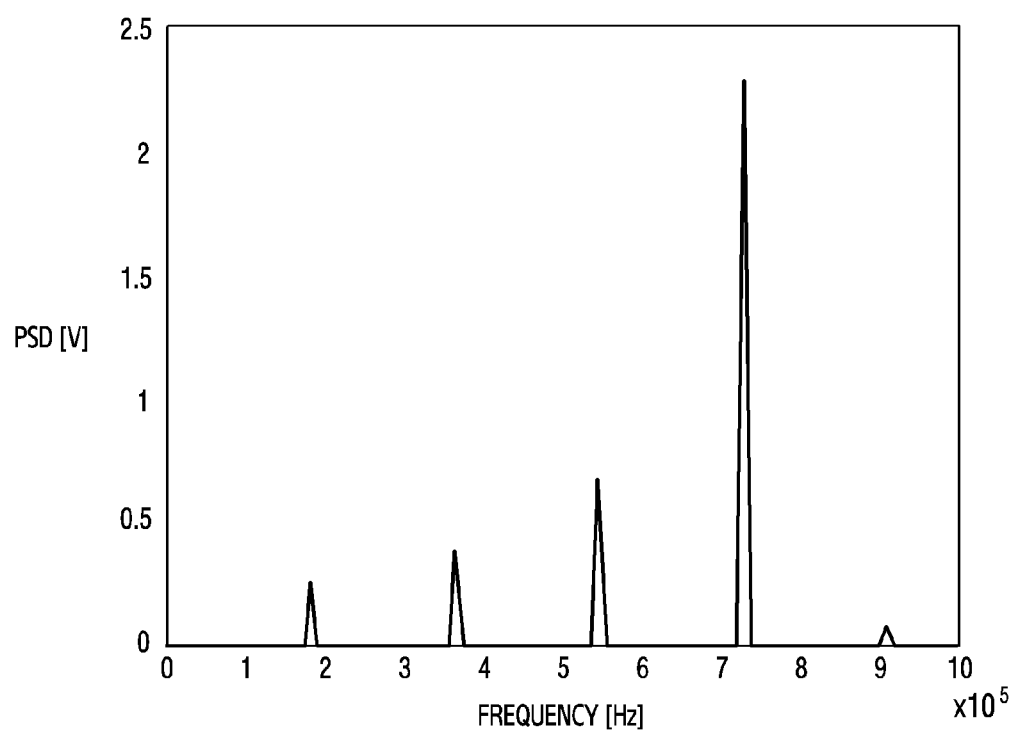

In operation 1107, the electronic device 101 may convert the average value to a value expressed on the PSD scale. By converting the average value to the value expressed on the PSD scale, the electronic device 101 may convert self-noise data to be in the form which is usable for compensation. For example, the electronic device 101 may convert an average self-noise expressed on the log scale as shown in FIG. 12E into a value expressed on the PSD scale as shown in FIG. 12F.

Figure 13:
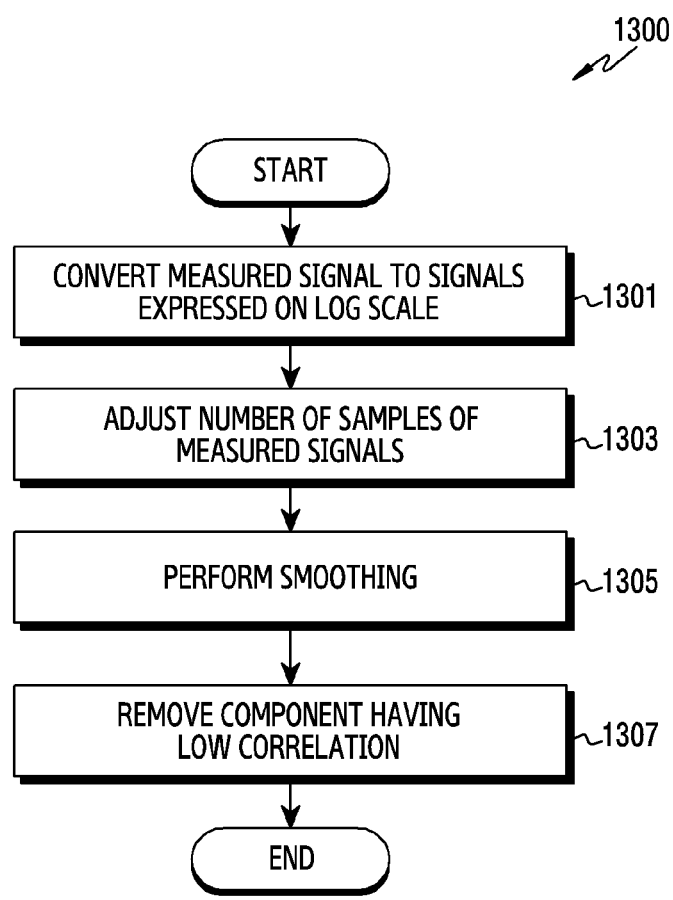
FIG. 13 is a flowchart illustrating a process of removing a time-varying component from a measured self-noise, by an electronic device according to various embodiments.

FIG. 13 is a flowchart 1300 illustrating a process of removing a time-varying component from a measured self-noise, by an electronic device according to various embodiments. FIGS. 14A to 14D are diagrams illustrating a process of modification of a signal in order to remove a time-varying component of a self-noise according to various embodiments. A subject that operates according to the flowchart 1300 of FIG. 13 may be understood as the electronic device 101 or a component (e.g., the processor 120 or the EM sensor 201) of the electronic device 101. The flowchart 1300 of FIG. 13 illustrates operations of generating self-noise data by an electronic device. According to an embodiment, the operations may be performed by a server (e.g., the server 108).

Figure 14A:
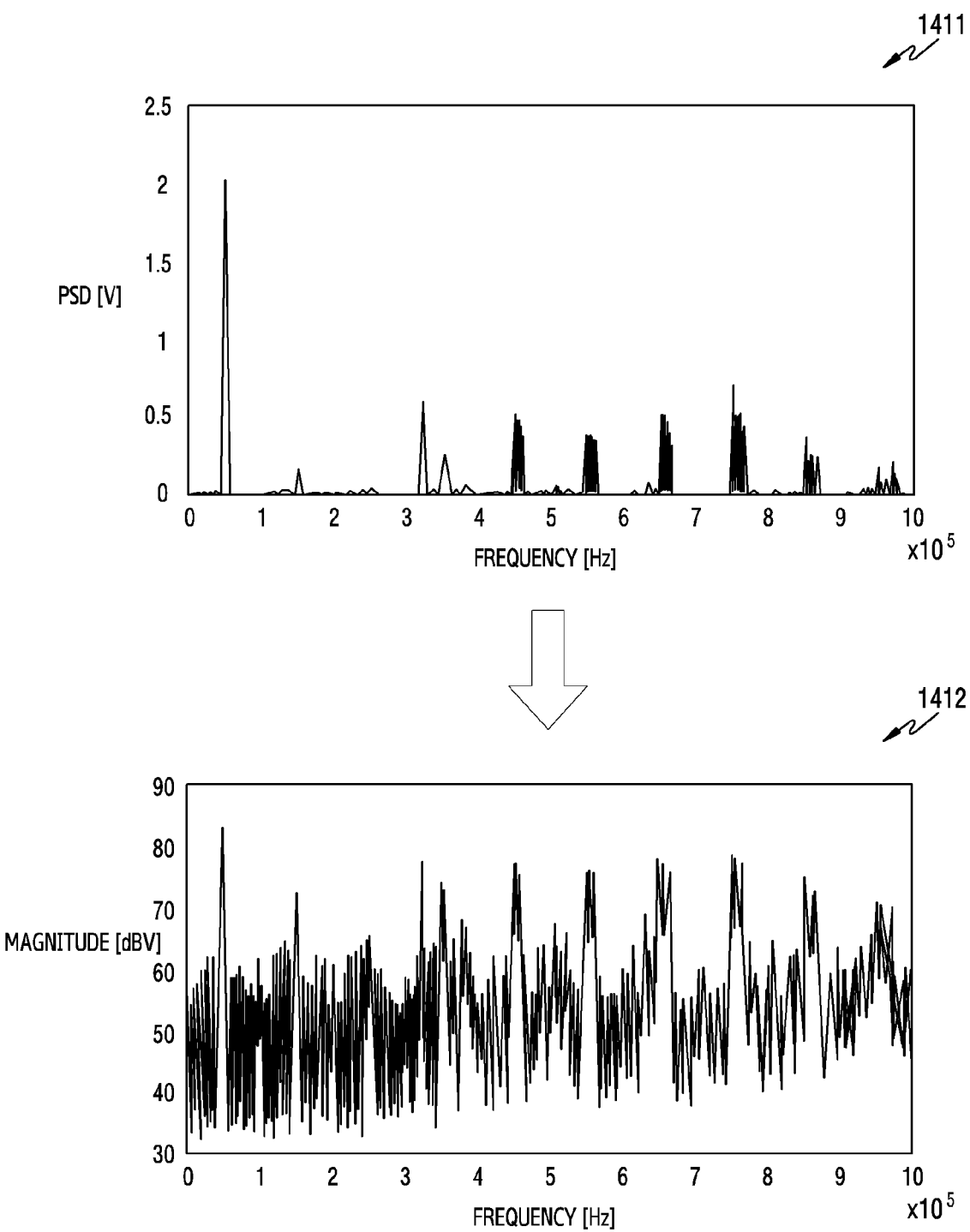
FIGS. 14A to 14D are diagrams illustrating a process of modification of a signal in order to remove a time-varying component of a self-noise according to various embodiments.
Figure 14B:
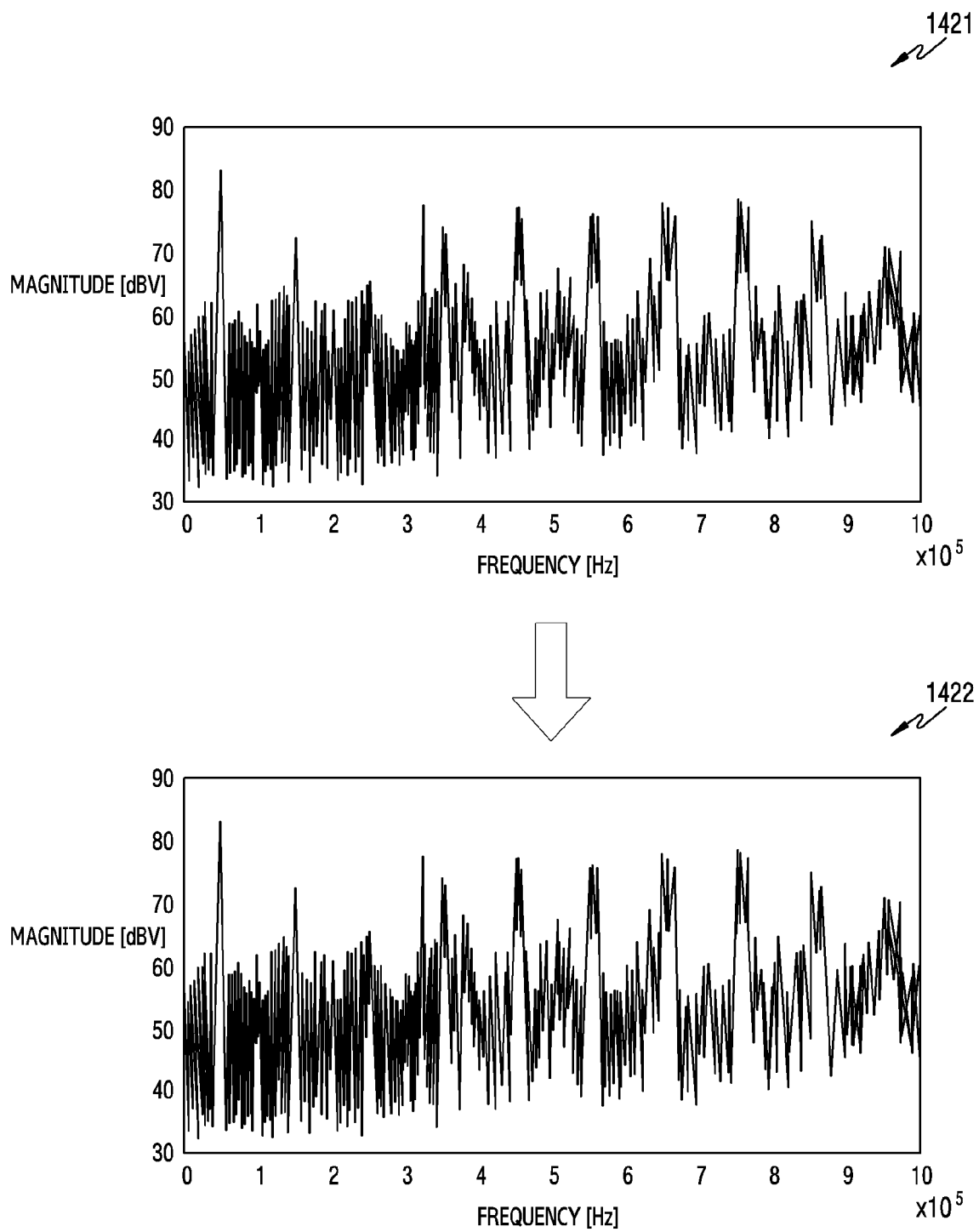
Figure 14C:
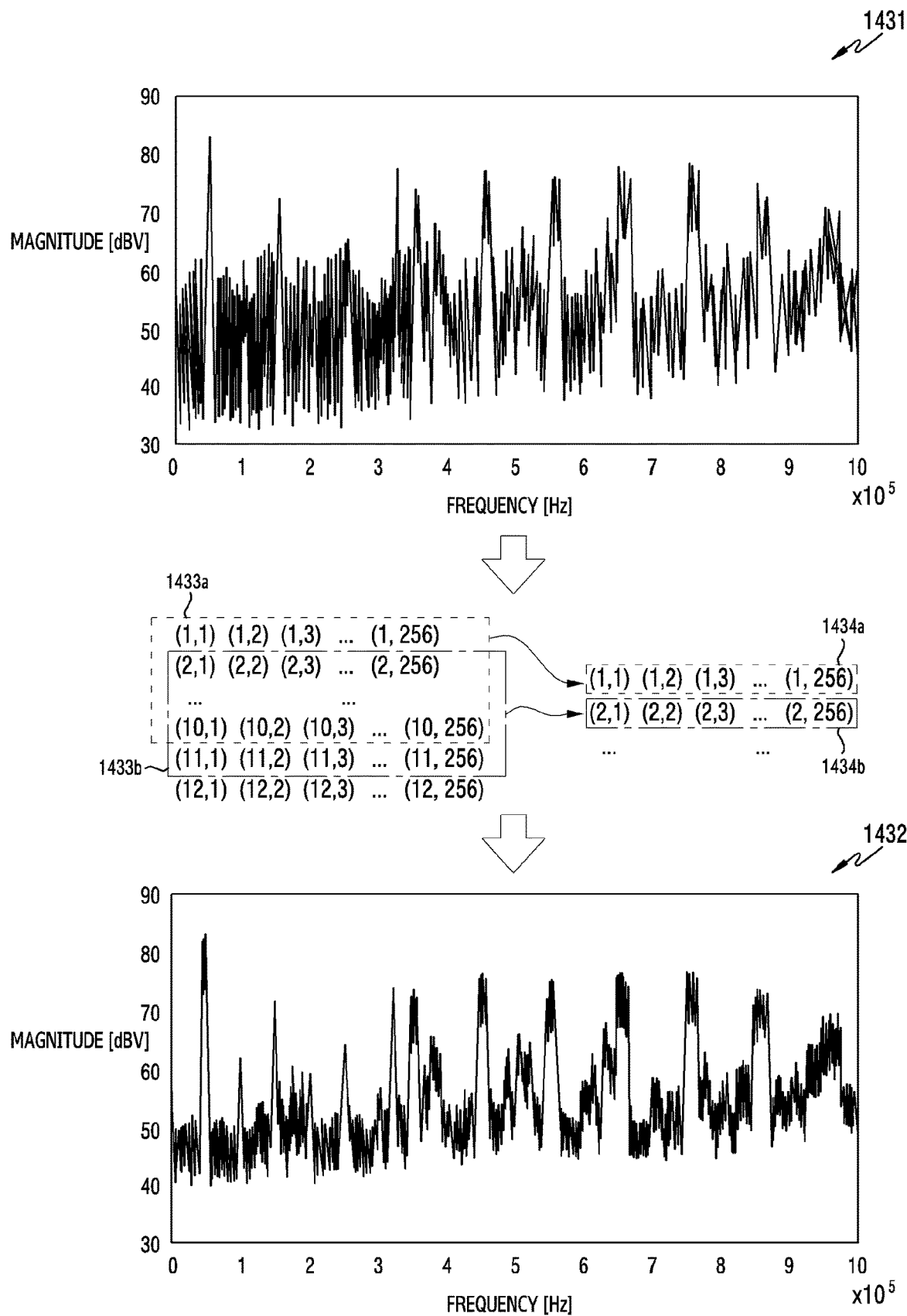

Referring to FIG. 13, in operation 1301, the electronic device 101 (e.g., the processor 120 or the EM sensor 201) may convert measured signals to signals expressed on a log scale. For example, referring to FIG. 14A, a measured signal 1411 may be converted to a signal 1412 expressed on the log scale. FIG. 14A illustrates graphs on which measured signals, obtained by measurement performed approximately 200 times, are plotted overlappingly. The signal 1411 is expressed on a PSD scale, and the signal 1412 is expressed on the log scale. Since the measured signals are converted to log scale signals, like the signal 1412 of FIG. 14A, the measured signals may be in the form that allows easy comparison of size of signals in the entire frequency range. For example, the signal 1412 may be a result of applying 10 $\log_{10}$ to the signal 1411.

In operation 1303, the electronic device 101 may adjust the number of samples of the measured signals. The electronic device 101 may convert N samples to one sample in order to reduce the amount of operations, and one sample may have the maximum value, the minimum value, or the average value of the N samples. For example, in the case in which two samples are converted to one sample, a signal 1421 including 200 measured signals, each of which includes 521 samples may be converted to a signal 1422 including 200 measured signals, each of which includes 256 samples. Operation 1303 may be performed using a pooling function.

In operation 1305, the electronic device 101 may perform smoothing. According to an embodiment, the electronic device 101 may convert the measured signals to average signals using a sliding window, so as to perform smoothing. For example, the electronic device 101 may average n measured signals in units of samples, so as to generate a single representative signal of the n measured signals. For example, referring to FIG. 14C, in a signal 1431 including 200 measured signals, a first average signal 1434a may be derived from the first to $n^{th}$ signals 1433a, and a second average signal 1434b may be derived from the second to $n+1^{th}$ signals 1433b. When the similar operation is performed from the $200-n+1^{th}$ to $200^{th}$ signals, a signal 1432 including 200–n average signals may be determined.

Figure 14D:
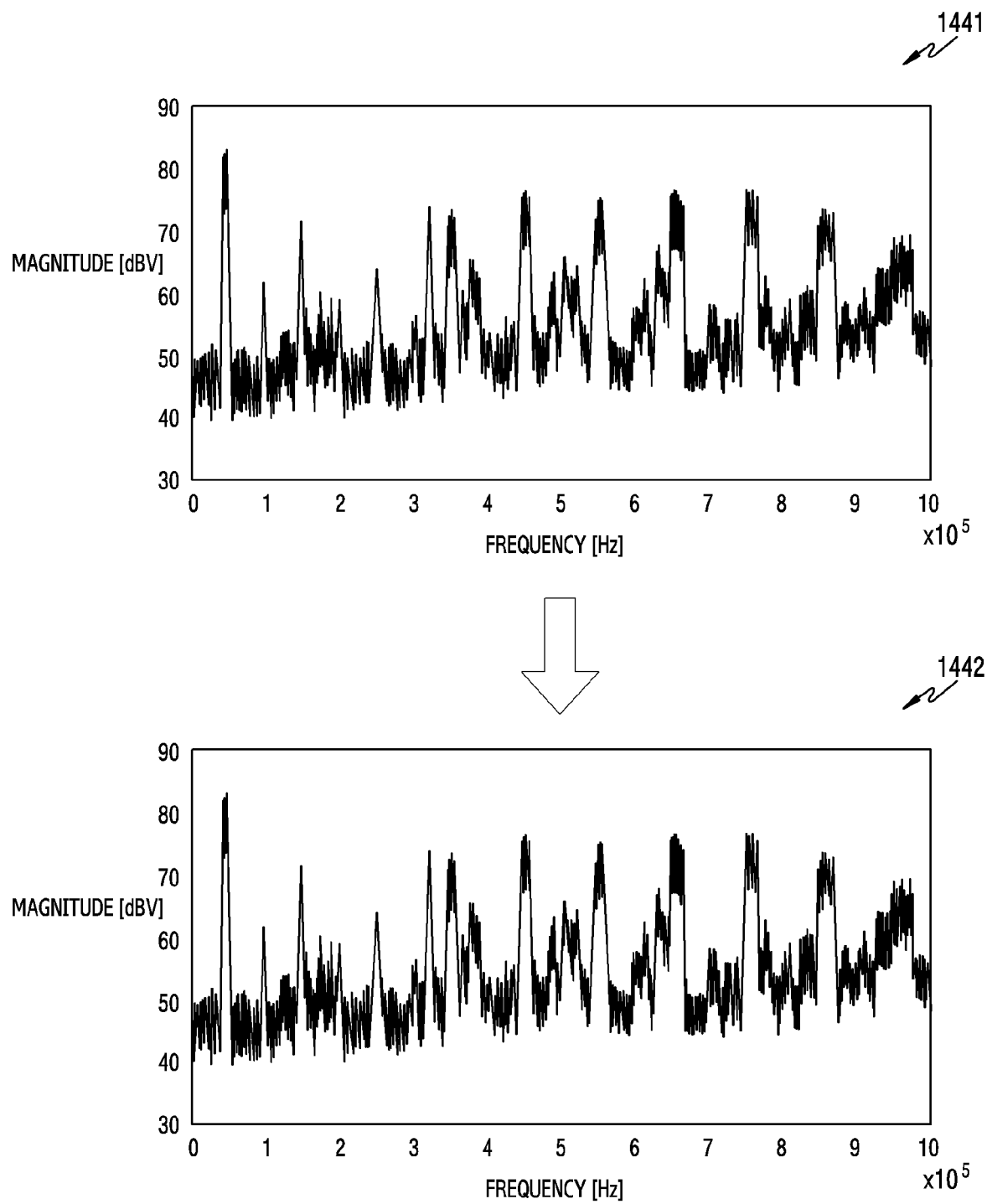

In operation 1307, the electronic device 101 may remove a component having a low correlation. The electronic device 101 may remove some average signals having a correlation less than or equal to a reference among the plurality of average signals. For example, the electronic device 101 may group average signals into m groups, may calculate correlation values of the average signals in each group, and may remove a group where a correlation less than or equal to a threshold occurs at least a predetermined number of times. For example, if 10 average signals are included in a single group, a threshold is 0.7, and the predetermined number of times is 9, a signal 1441 may be converted into a signal 1442 as shown in FIG. 14D. For example, operation 1305 may be performed using the Pearson pruning function.

According to above-described various embodiments, self-noise data including at least one compensation self-noise may be generated. The self-noise data may be used for performing compensation with respect to a measured signal, in order to identify an external electronic device (e.g., the electronic device 101). In the above-described embodiments, it has been described that a compensation self-noise is produced by the electronic device 101. However, according to an embodiment, a compensation self-noise may be produced by a server (e.g., the server 108). According to an embodiment, after a compensation self-noise is initially produced by a server, the compensation self-noise may be updated by the electronic device 101. Hereinafter, an embodiment of identifying an external electronic device using a compensation self-noise and an embodiment of updating a compensation self-noise will be described.

Figure 15:
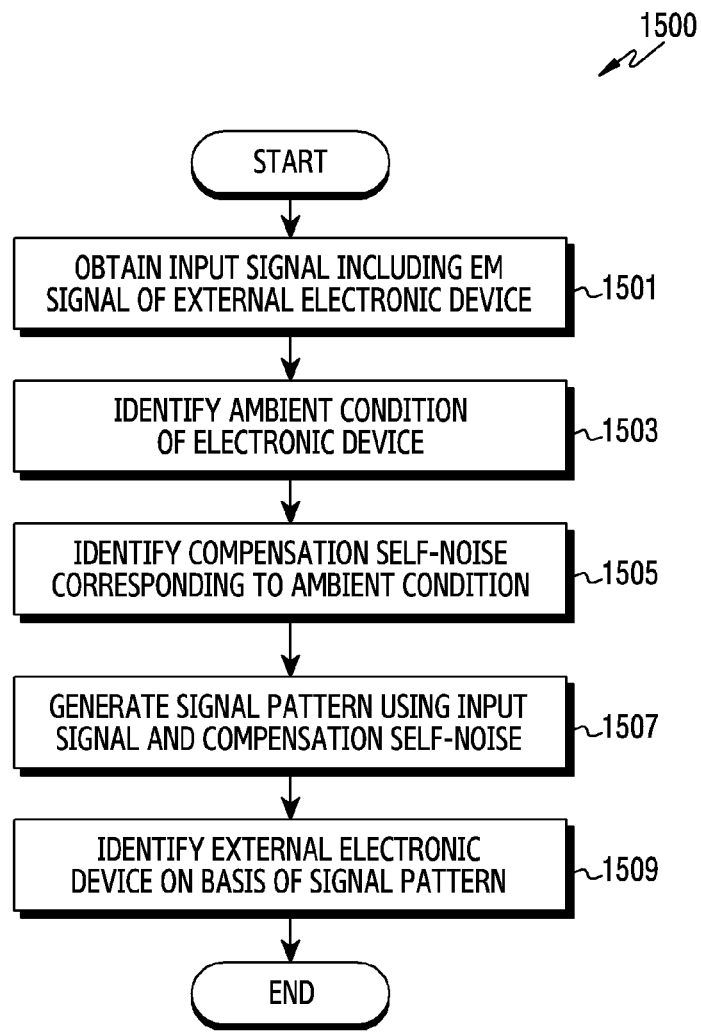
FIG. 15 is a flowchart illustrating a process of identifying an external electronic device using an electromagnetic signal, by an electronic device according to various embodiments.

FIG. 15 is a flowchart 1500 illustrating a process of identifying an external electronic device using an electromagnetic signal, by an electronic device according to various embodiments, A subject that operates according to the flowchart 1500 of FIG. 15 may be understood as the electronic device 101 or a component (e.g., the processor 120 or the EM sensor 201) of the electronic device 101.

Referring to FIG. 15, in operation 1501, the electronic device 101 (e.g., the processor 120 or the EM sensor 201) may obtain an input signal including an electromagnetic signal of an external electronic device (e.g., the electronic device 102). The electronic device 101 may obtain an input signal including an electromagnetic signal which is generated from an external electronic device, via an antenna installed in the electronic device 101. The input signal may further include a self-noise generated from the electronic device 101, in addition to the electromagnetic signal. According to an embodiment, the electronic device 101 may remove a time-varying component from the input signal. For example, the electronic device 101 may compare a plurality of measured signal obtained at different points in time, may identify the time-varying component that is temporarily generated from the input signals, and may remove the same. For example, the electronic device 101 may perform operations similar to the operations described with reference to FIG. 11, with respect to the input signal.

In operation 1503, the electronic device 101 may identify an ambient condition of the electronic device 101. The ambient condition is a combination of factors that may affect a self-noise of the electronic device 101, and may include, for example, at least one of whether an external power source (e.g., a TA) is connected or whether another module (e.g., a display, a camera, and/or a communication module) is activated. The electronic device 101 may identify the ambient condition on the basis of at least one of a currently running application, a power charge state, a power consumption state, an internal control signal, or a flag indicating the state of each module.

In operation 1505, the electronic device 101 may identify a component self-noise that corresponds to an ambient condition. From self-noise data, which includes a compensation self-noise for each ambient condition and is stored in the memory (e.g., the memory 130) of the electronic device 101, a compensation self-noise corresponding to the identified ambient condition may be identified. The stored self-noise data may be data produced by a server (e.g., the server 108), or may be data generate or updated by the electronic device 101.

In operation 1507, the electronic device 101 may generate a signal pattern using the input signal and the compensation self-noise. According to an embodiment, the electronic device 101 may deduct the compensation self-noise from the input signal, so as to generate the signal pattern. The signal pattern may be the electromagnetic signal of the external electronic device.

In operation 1509, the electronic device 101 may identify the external electronic device on the basis of the signal pattern. The electronic device 101 may identify the external electronic device on the basis of at least a part of the signal pattern. According to an embodiment, the electronic device 101 may identify the external electronic device using learning model data. For example, the electronic device 101 may compare the signal pattern with various signals included in the learning model data, and on the basis of the comparison result, may determine a candidate device having an electromagnetic signal which is the most similar to the signal pattern, among candidate devices.

Figure 16:
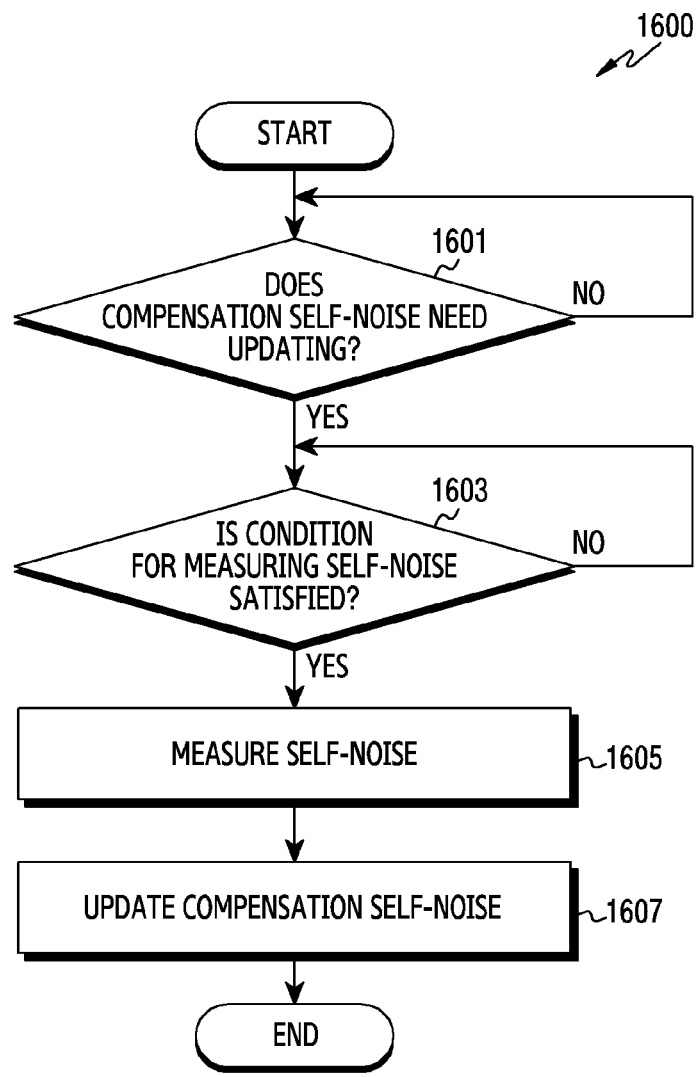
FIG. 16 is a flowchart illustrating a process of updating compensation self-noise data, by an electronic device according to various embodiments.

FIG. 16 is a flowchart 1600 illustrating a process of updating compensation self-noise data, by an electronic device according to various embodiments. A subject that operates according to the flowchart 1600 of FIG. 16 may be understood as the electronic device 101 or a component (e.g., the processor 120 or the EM sensor 201) of the electronic device 101.

Referring to FIG. 16, in operation 1601, the electronic device 101 (e.g., the processor 120 or the EM sensor 201) may determine whether a compensation self-noise needs updating. Criteria for determining whether the compensation self-noise needs updating may be defined variously. For example, the electronic device 101 may determine whether the compensation self-noise needs updating, on the basis of a record of results of identifying an external electronic device (e.g., the electronic device 102) using a compensation self-noise included in the self-noise data stored in the memory (e.g., the memory 130). According to an embodiment, if identification fails successively at least a predetermined number of times, it is determined that updating the compensation self-noise is needed. According to an embodiment, if identification fails a number of times greater than or equal to a threshold number during a predetermined period of time, it is determined that updating the compensation self-noise is needed.

In operation 1603, the electronic device 101 may determine whether a condition for measuring a self-noise is satisfied. As less ambient noise exists, the self-noise may be measured more accurately. The electronic device 101 may identify whether the electronic device 101 is determined as being placed in an environment where no ambient noise is expected. For example, whether the condition for measuring is satisfied may be determined using at least one of a microphone, a camera, or a sensor. According to an embodiment, operation 1603 may be omitted.

In operation 1605, the electronic device 101 may measure a self-noise. For example, the electronic device 101 may measure signals that flow into an antenna installed in the electronic device 101. Through the above, the electronic device 101 may obtain a plurality of measured signals. According to an embodiment, the electronic device 101 may adjust at least one measurement parameter so as to have an accuracy higher than the accuracy of the currently stored compensation self-noise. For example, the electronic device 101 may set a sampling rate, the number of repetitions, or a measurement duration to be higher than the value used when the currently stored compensation self-noise is generated.

In operation 1607, the electronic device 101 may update the component self-noise. The electronic device 101 may determine a compensation self-noise on the basis of the result of measurement of the self-noise, and may update the compensation self-noise currently stored in the memory. According to an embodiment, the electronic device 101 may remove a time-varying component from measured signals, may perform normalization, and may determine the average value of the signals. For example, the electronic device may generate a compensation self-noise by extracting only a frequency component having a high reproducibility from the measured signals. For example, the electronic device 101 may remove a frequency component having a low reproducibility via sliding window averaging and a correlation operation. For example, the electronic device 101 may perform at least some of the operations which have been described with reference to FIGS. 11, 13, and 15. The electronic device 101 may replace the compensation self-noise stored in the memory with the compensation self-noise generated in operation 1605. Subsequently, the updated compensation self-noise may be used when an operation of identifying an external electronic device is performed in the future.

According to above-described various embodiments, the electronic device 101 may cancel an ambient noise and/or a self-noise in real time, and may collect only the unique electromagnetic signal of an external electronic device that the electronic device desires to identify. When the electronic device extracts only the unique electromagnetic signal of the external electronic device which is the measurement target, and uses the extracted electromagnetic signal for machine learning, a recognition rate may be dramatically improved. When the electronic device establishes a DB only with unique electromagnetic signals from which a self-noise is canceled, any electronic device that contains an electromagnetic detection system is capable of using the corresponding DB.

According to various embodiments, an operation method of an electronic device (e.g., the electronic device 101) may include: obtaining an input signal including an electromagnetic (EM) signal of an external electronic device and a self-noise using an electromagnetic (EM) sensor; identifying an ambient condition of the electronic device; identifying a compensation self-noise corresponding to the ambient condition; generating a signal pattern on the basis of the input signal and the compensation self-noise; and identifying the external electronic device on the basis of at least a part of the signal pattern.

According to various embodiments, the ambient condition may include at least one of whether an external power source is connected or whether another module is activated.

According to various embodiments, the compensation self-noise may be determined on the basis of a result of removing a time-varying component from measured signals associated with the self-noise obtained using the EM sensor.

According to various embodiments, the method may further include: determining whether the compensation self-noise needs updating; measuring the self-noise; and updating the compensation self-noise on the basis of a result of the measurement of the self-noise.

According to various embodiments, the method may further include setting a sampling rate for the measurement, a number of repetitions, or a measurement duration to be greater than a value used when a currently stored compensation self-noise is generated.

According to various embodiments, the operation of generating the compensation self-noise may include: obtaining a plurality of measured signals; removing a time-varying component from the plurality of measured signals; and generating an average signal of the signals from which the time-varying component is removed.

Figure 17A:
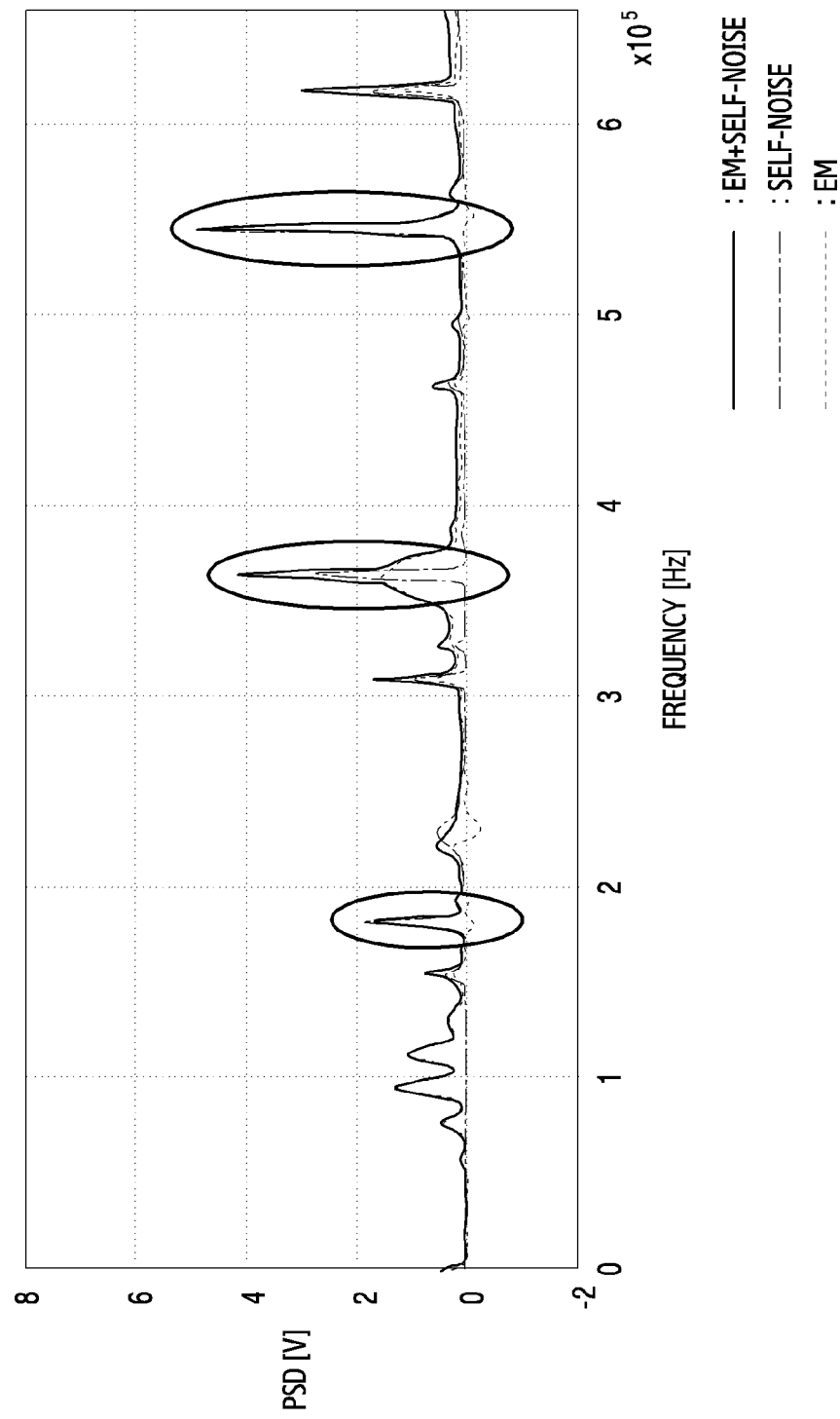
FIG. 17A is a diagram illustrating an example of an electromagnetic signal to which compensation is performed using a compensation self-noise according to various embodiments.
Figure 17B:
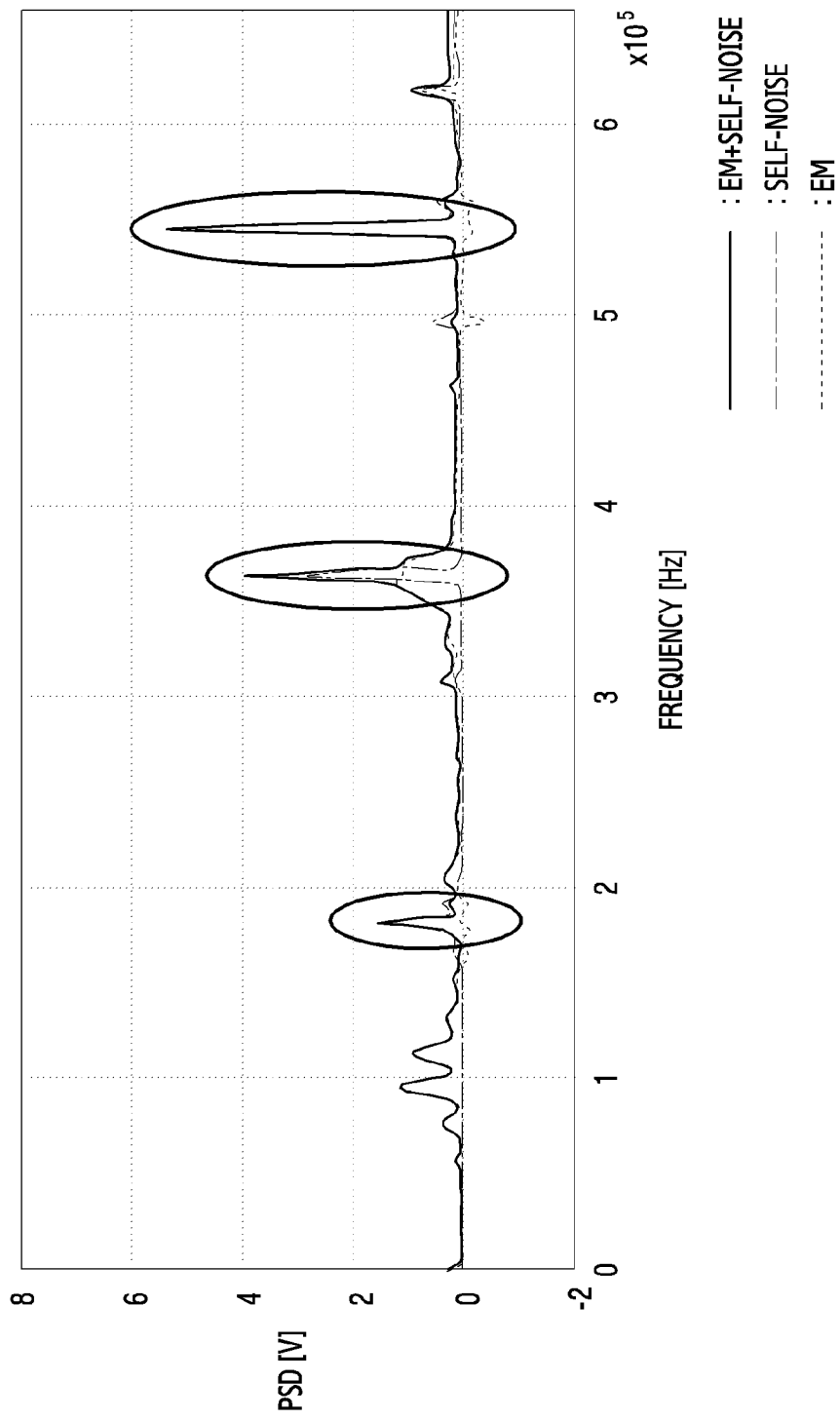
FIG. 17B is a diagram illustrating an example of an electromagnetic signal to which compensation is performed using a compensation self-noise according to various embodiments.
Figure 17C:
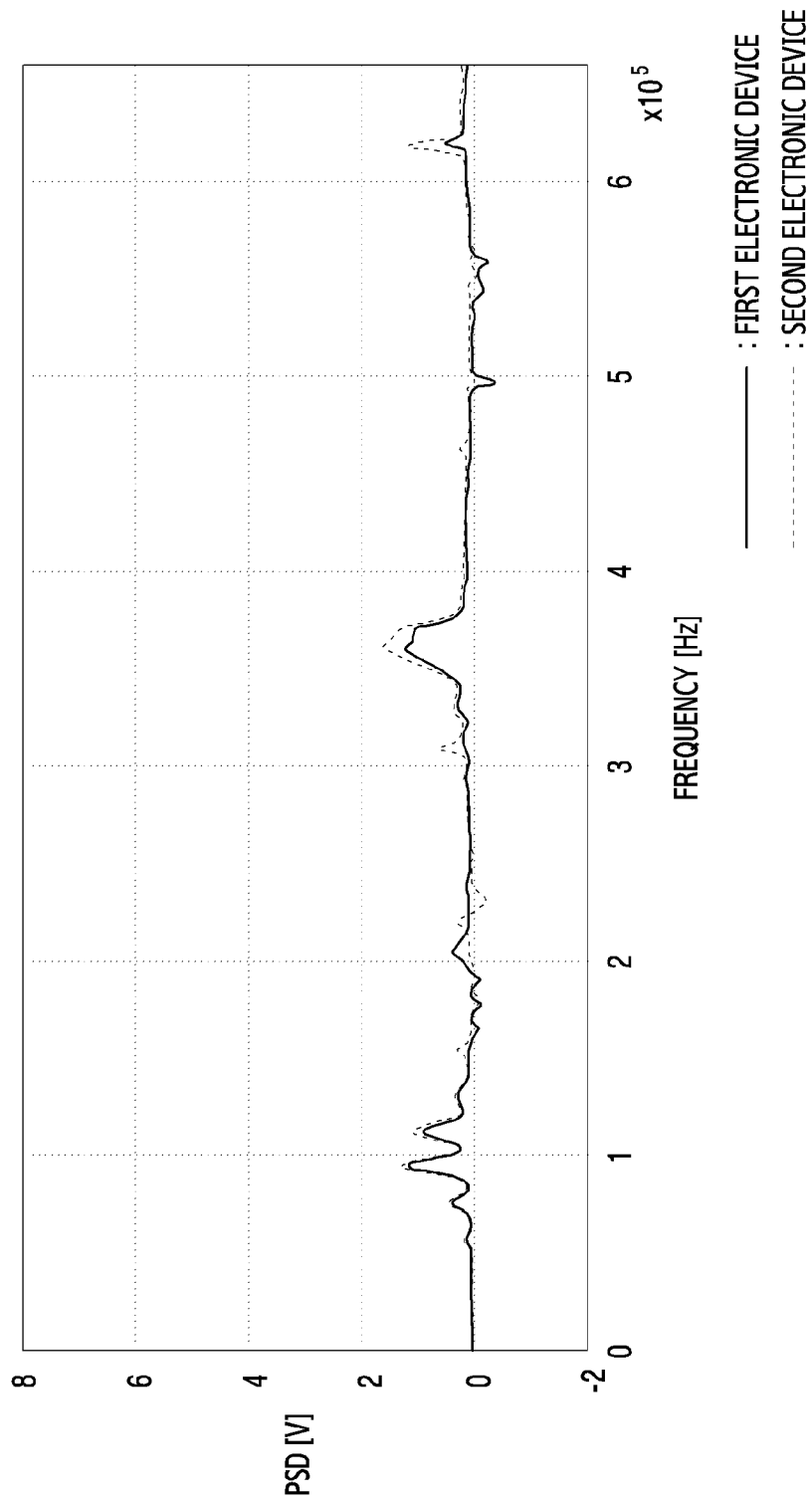
FIG. 17C is a diagram illustrating an example of an electromagnetic signal to which compensation is performed using a compensation self-noise according to various embodiments.

FIG. 17A is a diagram illustrating an example of an electromagnetic signal to compensation is performed using a compensation self-noise according to various embodiments, FIG. 17B is a diagram illustrating an example of an electromagnetic signal to which compensation is performed using a compensation self-noise according to various embodiments, and FIG. 17C is a diagram illustrating an example of an electromagnetic signal to which compensation is performed using a compensation self-noise according to various embodiments. FIG. 17A illustrates a signal and a self-noise measured by a first electronic device. FIG. 17B illustrates a signal and a self-noise measured by the first electronic device. FIG. 17C illustrates results obtained after cancelling a self-noise from the measured signals of FIGS. 17A and 17B.

Referring to FIGS. 17A, 17B, and 17C, the measured signal (e.g., an electromagnetic signal+a self-noise) of FIG. 17A and the measured signal (e.g., an electromagnetic signal+a self-noise) of FIG. 17B may be different from each other. By comparing the different measured signals excluding a self-noise, it is recognized that the different measured signals do not have a significant difference.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context dearly indicates otherwise. As used herein, each of such phrases as "A or B," "at least one of A and B," "at least one of A or B," "A B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Although the present disclosure has been described with various embodiments, various changes and modifications may be suggested to one skilled in the art. It is intended that the present disclosure encompass such changes and modifications as fall within the scope of the appended claims.

What is claimed is:

1. An electronic device comprising:
   a housing comprising:
      a first side facing in a first direction,
      a second side facing in a second direction opposite to the first direction, and
      a lateral member at least enclosing a space between the first side and the second side;
   a display displayed through at least a part of the first side;
   at least one electromagnetic (EM) sensor disposed in the housing or the space, the EM sensor configured to sense an EM signal;
   a processor disposed in the housing, the processor operably connected to the display and the EM sensor; and
   a memory operably connected to the processor,
   wherein the memory stores instructions, which, when executed, enable the processor to:
      obtain an input signal including an electromagnetic signal of an external electronic device and a self-noise signal, using the EM sensor;
      identify an ambient condition of the electronic device;
      identify a compensation self-noise corresponding to the ambient condition;
      generate a signal pattern by removing the self-noise signal from the input signal based on the input signal and the compensation self-noise; and
      identify the external electronic device based on at least a part of the signal pattern.

2. The electronic device of claim 1, wherein the ambient condition comprises at least one of:
   whether an external power source is connected; or
   whether another module is activated.

3. The electronic device of claim 1, wherein the instructions further enable the processor to:
   determine that the compensation self-noise needs updating;
   measure the self-noise signal; and
   update the compensation self-noise based on a result of measurement of the self-noise signal.

4. The electronic device of claim 3, wherein the instructions further enable the processor to determine whether the compensation self-noise needs updating based on a record of results of identification of the external electronic device using the compensation self-noise.

5. The electronic device of claim 3, wherein the instructions further enable the processor to set a sampling rate for the measurement, a number of repetitions, or a measurement duration to be greater than a value used when a currently stored compensation self-noise is generated.

6. The electronic device of claim 3, wherein, for the identification of the compensation self-noise, the instructions further enable the processor to:
   obtain a plurality of measured signals;
   remove a time-varying component from the plurality of measured signals; and
   generate an average signal of signals from which the time-varying component is removed.

7. The electronic device of claim 6, wherein, for removing the time-varying component, the instructions further enable the processor to:
   obtain average signals by performing sliding window averaging with respect to the plurality of measured signals; and
   remove at least one average signal having a correlation less than or equal to a reference among the average signals.

8. An electronic device comprising:
   a housing comprising:
      a first side facing in a first direction,
      a second side facing in a second direction opposite to the first direction, and
      a lateral member at least enclosing a space between the first side and the second side;
   a display displayed through at least a part of the first side;
   at least one EM sensor disposed in the housing or the space, the EM sensor configured to sense an EM signal;
   a processor disposed in the housing, the processor operably connected to the display and the EM sensor; and
   a memory operably connected to the processor, wherein the memory comprises instructions, which, when executed, enable the processor to:
- determine at least one measurement parameter in association with measurement of a self-noise;
- measure the self-noise according to the at least one measurement parameter;
- generate a compensation self-noise based on a result of measurement of the self-noise;
- identify an ambient condition when measuring the self-noise; and
- store information associated with the ambient condition together with the compensation self-noise.

9. The electronic device of claim 8, wherein the at least one measurement parameter comprises at least one of a sampling rate, a number of repetitions, or a measurement duration.

10. The electronic device of claim 9, wherein the instructions further enable the processor to set the sampling rate, the number of repetitions, or the measurement duration according to a required accuracy.

11. The electronic device of claim 9, wherein, for the generation of the compensation self-noise, the instructions further enable the processor to:
- obtain a plurality of measured signals;
- remove a time-varying component from the plurality of measured signals; and
- generate an average signal of the signals from which the time-varying component is removed.

12. The electronic device of claim 11, wherein, for removing the time-varying component, the instructions further enable the processor to:
- obtain average signals by performing sliding window averaging with respect to the plurality of measured signals; and
- remove at least one average signal having a correlation less than or equal to a reference among the average signals.

13. An operation method of an electronic device, the method comprising:
- obtaining an input signal comprising an electromagnetic (EM) signal of an external electronic device and a self-noise signal using an EM sensor;
- identifying an ambient condition of the electronic device;
- identifying a compensation self-noise corresponding to the ambient condition;
- generating a signal pattern by removing the self-noise signal from the input signal based on the input signal and the compensation self-noise; and
- identifying the external electronic device based on at least a part of the signal pattern.

14. The method of claim 13, wherein the ambient condition comprises at least one of:
- whether an external power source is connected; or
- whether another module is activated.

15. The method of claim 13, wherein the compensation self-noise is determined based on a result of removing a time-varying component from measured signals associated with the self-noise signal obtained using the EM sensor.

16. The method of claim 13, further comprising:
- determining whether the compensation self-noise needs updating;
- measuring the self-noise signal; and
- updating the compensation self-noise based on a result of the measurement of the self-noise signal.

17. The method of claim 16, further comprising setting a sampling rate for the measurement, a number of repetitions, or a measurement duration to be greater than a value used when a currently stored compensation self-noise is generated.

18. The method of claim 16, wherein the generating the compensation self-noise comprises:
- obtaining a plurality of measured signals;
- removing a time-varying component from the plurality of measured signals; and
- generating an average signal of the signals from which the time-varying component is removed.

* * * * *